(12) United States Patent
Kono et al.

(10) Patent No.: US 9,123,728 B2
(45) Date of Patent: Sep. 1, 2015

(54) SEMICONDUCTOR DEVICE AND METHOD FOR MANUFACTURING SEMICONDUCTOR DEVICE

(71) Applicant: FUJITSU SEMICONDUCTOR LIMITED, Yokohama-shi, Kanagawa (JP)

(72) Inventors: Takahiro Kono, Tokyo (JP); Shinichi Akiyama, Tokyo (JP); Hirofumi Watatani, Tokyo (JP); Tamotsu Owada, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/160,951

(22) Filed: Jan. 22, 2014

(65) Prior Publication Data

US 2014/0131873 A1 May 15, 2014

Related U.S. Application Data

(62) Division of application No. 12/366,020, filed on Feb. 5, 2009, now Pat. No. 8,669,177.

(30) Foreign Application Priority Data

May 12, 2008 (JP) ................................. 2008-124583

(51) Int. Cl.
*H01L 23/52* (2006.01)
*H01L 23/532* (2006.01)
*H01L 21/768* (2006.01)

(52) U.S. Cl.
CPC .... *H01L 23/53238* (2013.01); *H01L 21/76835* (2013.01); *H01L 21/76844* (2013.01);
(Continued)

(58) Field of Classification Search
CPC ..................... H01L 23/53238; H01L 23/53228

USPC .......... 257/751, 753, 767, E21.584, E21.591, 257/E23.161; 438/653, 652, 655, 656, 643
See application file for complete search history.

(56) References Cited

U.S. PATENT DOCUMENTS

| 5,529,954 A | 6/1996 | Iijima et al. |
|---|---|---|
| 7,396,759 B1 | 7/2008 | van Schravendijk et al. |

(Continued)

FOREIGN PATENT DOCUMENTS

| JP | 6-204218 A | 7/1994 |
|---|---|---|
| JP | 2002-246391 A | 8/2002 |

(Continued)

OTHER PUBLICATIONS

Japanese Office Action dated Feb. 19, 2013, issued in corresponding Japanese patent application No. 2008-24583, w/ partial English translation.

(Continued)

*Primary Examiner* — Kimberly Rizkallah
*Assistant Examiner* — Maria Ligai
(74) *Attorney, Agent, or Firm* — Westerman, Hattori, Daniels & Adrian, LLP

(57) ABSTRACT

A semiconductor device includes an insulation film formed above a semiconductor substrate, a conductor containing Cu formed in the insulation film, and a layer film formed between the insulation film and the conductor and formed of a first metal film containing Ti and a second metal film different from the first metal film, a layer containing Ti and Si is formed on the surface of the conductor.

7 Claims, 24 Drawing Sheets

(52) U.S. Cl.
CPC .... *H01L21/76849* (2013.01); *H01L 21/76856* (2013.01); *H01L 21/76862* (2013.01); *H01L 21/76867* (2013.01); *H01L 23/53295* (2013.01); *H01L 2221/1036* (2013.01); *H01L 2924/0002* (2013.01)

(56) References Cited

U.S. PATENT DOCUMENTS

| | | | |
|---|---|---|---|
| 2002/0048926 A1 | 4/2002 | Konecni | |
| 2002/0155702 A1 | 10/2002 | Aoki et al. | |
| 2003/0157799 A1* | 8/2003 | Ding et al. | 438/687 |
| 2004/0150113 A1 | 8/2004 | Tonegawa | |
| 2005/0153544 A1 | 7/2005 | Suh et al. | |
| 2006/0205204 A1* | 9/2006 | Beck | 438/628 |
| 2006/0214305 A1 | 9/2006 | Sakata et al. | |
| 2006/0220253 A1 | 10/2006 | Hamada et al. | |
| 2007/0278624 A1* | 12/2007 | Anderson et al. | 257/622 |
| 2008/0042281 A1* | 2/2008 | Abe | 257/751 |
| 2009/0051034 A1 | 2/2009 | Pai et al. | |
| 2010/0044865 A1* | 2/2010 | Torres et al. | 257/751 |

FOREIGN PATENT DOCUMENTS

| | | |
|---|---|---|
| JP | 2004-228445 A | 8/2004 |
| JP | 2004-349572 A | 12/2004 |
| JP | 2006-229207 A | 8/2006 |
| JP | 2008-47675 A | 2/2008 |

OTHER PUBLICATIONS

A. Sakata et al., "Reliablity Improvement by Adopting Ti-barrier Metal for Porous Low-k ILD Structure", Proceedings of International Interconnection Technology Conference, 2006, pp. 101-103.

* cited by examiner

SEMICONDUCTOR DEVICE AND METHOD FOR MANUFACTURING SEMICONDUCTOR DEVICE

CROSS-REFERENCE TO RELATED APPLICATION

This application is a divisional of U.S. application Ser. No. 12/366,020, filed on Feb. 5, 2009, which is based upon and claims the benefit of priority of the prior Japanese Patent Application No. 2008-124583, filed on May 12, 2008, the entire contents of which are incorporated herein by reference.

FIELD

The embodiments discussed herein are related to a semiconductor device and a method for manufacturing a semiconductor device.

BACKGROUND

Recently, as semiconductor devices are required to have higher speed and higher integration, lower resistance and smaller capacitance of the multilayer interconnection of the semiconductor devices are increasingly important objects. So far, for the low resistance of the multilayer interconnection, copper (Cu) has been used as an interconnection material. For the smaller capacitance of the multilayer interconnection, as the inter-layer insulation films with interconnections buried in, low dielectric constant (low-K) insulation films whose relative dielectric constants are lower than those of silicon oxide film and silicon nitride film are used.

For the interconnection structure thus using Cu as the interconnection material and low dielectric constant insulation films as the inter-layer insulation films, it is very important to improve the reliability of the interconnections represented by the electro-migration resistance and stress migration resistance.

SUMMARY

According to aspects of the embodiment, a semiconductor device includes an insulation film formed above a semiconductor substrate; a conductor containing Cu formed in the insulation film; and a layer film formed between the insulation film and the conductor and formed of a first metal film containing Ti and a second metal film different from the first metal film, a layer containing Ti and Si is formed on the surface of the conductor.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Above-described interconnection structure using Cu as the interconnection material and low dielectric constant (low-K) insulation films as the inter-layer insulation films has found it difficult to be good in both resistances of electro-migration resistance and stress migration resistance.

A method for manufacturing a semiconductor device including interconnections of Cu (Part 1) will be explained with reference to FIGS. 18A to 22B. FIGS. 18A to 22B are sectional views of the semiconductor device including interconnections of Cu, which illustrate the method for manufacturing the semiconductor device (Part 1).

First, on a semiconductor substrate 100 with active devices (not illustrated), such as transistors, etc., formed on, an inter-layer insulation film 102 of a low dielectric constant (low-K) insulation film is formed.

Figure 18A:
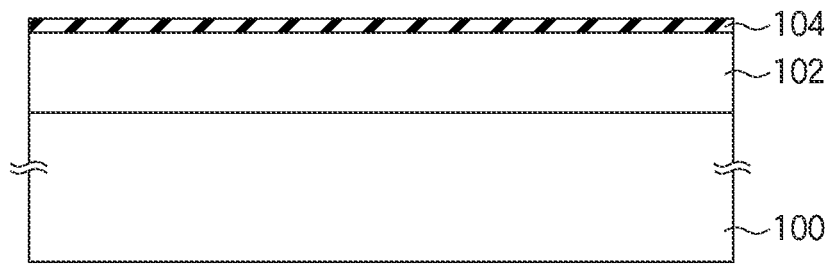
FIGS. 18A to 18C are sectional views of a semiconductor device in the steps of the method for manufacturing the semiconductor device (Part 1), which illustrate the method (Part 1)

Next, on the inter-layer insulation film 102, a cap film 104 is formed (see FIG. 18A).

Figure 18B:
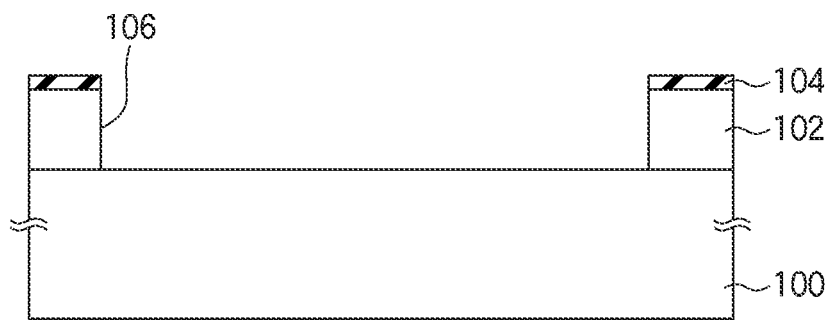

Next, by photolithography and dry etching, interconnection trenches 106 are formed in the cap film 104 and the inter-layer insulation film 102 (see FIG. 18B).

Figure 18C:
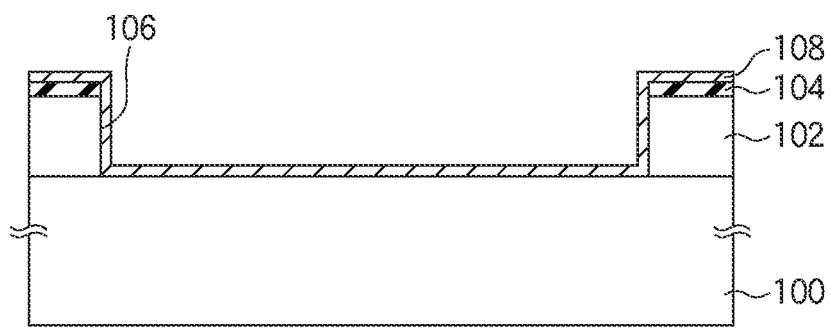

Then, on the side surface and the bottom surface of each interconnection trench 106 and on the cap film 104, a barrier film 108 of tantalum (Ta)-based material is formed by sputtering (see FIG. 18C). As the barrier metal film 108 of a Ta-based material, a Ta film, a tantalum nitride (TaN) film, or the layer film of a Ta film and a TaN film is formed. The barrier metal film 108 is for preventing the diffusion of the Cu of an interconnection 114 which will be described later into the inter-layer insulation film.

Figure 19A:
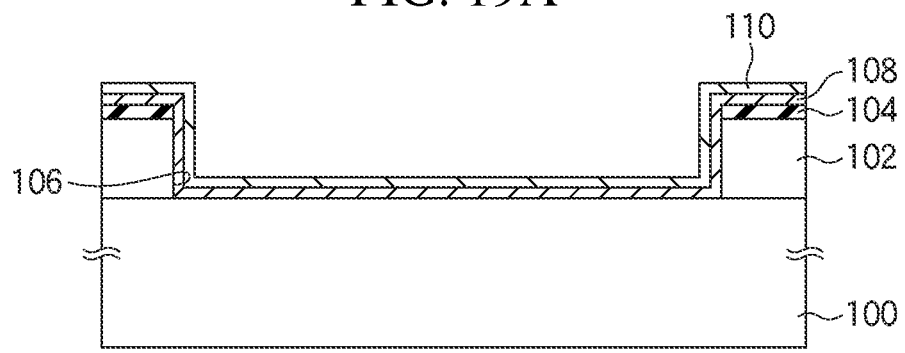
FIGS. 19A to 19C are sectional views of the semiconductor device in the steps of the method for manufacturing the semiconductor device (Part 1), which illustrate the method (Part 2)
Figure 19B:
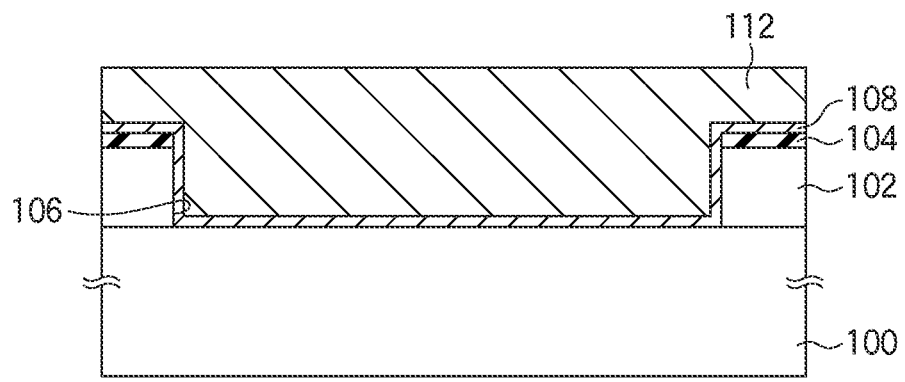
Figure 19C:
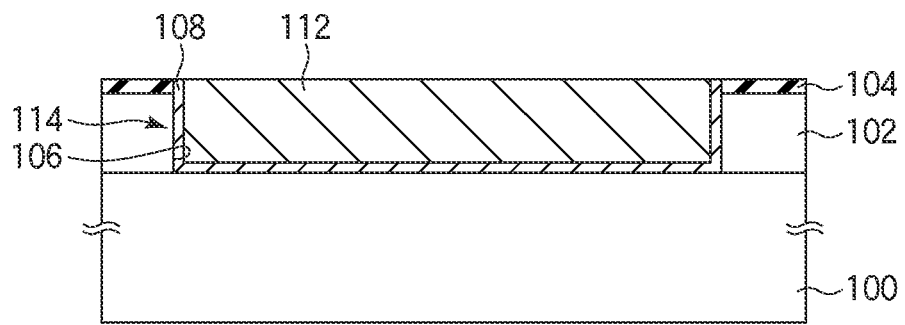

Then, on the barrier metal film 108, a seed film 110 of Cu film is formed by sputtering (see FIG. 19A). The seed film 110 functions as the electrode in forming a Cu film 112 by electroplating.

Then, on the seed film 110, a Cu film 112 is formed by electroplating. Thus, the interconnection trench 106 is filled with the Cu film 112 (see FIG. 19B).

Then, by CMP (Chemical Mechanical Polishing), the Cu film 112 and the barrier metal film 108 are polished until the surface of the cap film is exposed. Thus, an interconnection 114 of Cu is buried in the interconnection trench 106 (see FIG. 19C).

Next, on the interconnection 114 and the cap film 104, a barrier insulation film 116 is formed. The barrier insulation film 116 is for preventing the diffusion of the Cu of the interconnection 114 into the inter-layer insulation film.

Next, on the barrier insulation film 116, an inter-layer insulation film 118 of a low dielectric constant insulation film is formed.

Next, on the inter-layer insulation film 118, an inter-layer insulation film 120 of a low dielectric constant insulation film is formed.

Figure 20A:
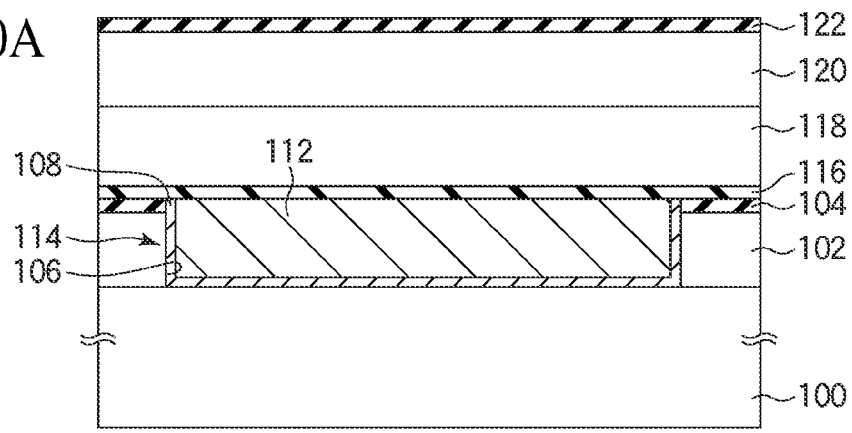
FIGS. 20A to 20C are sectional views of the semiconductor device in the steps of the method for manufacturing the semiconductor device (Part 1), which illustrate the method (Part 3)

Then, on the inter-layer insulation film 120, a cap film 122 is formed (see FIG. 20A).

Figure 20B:
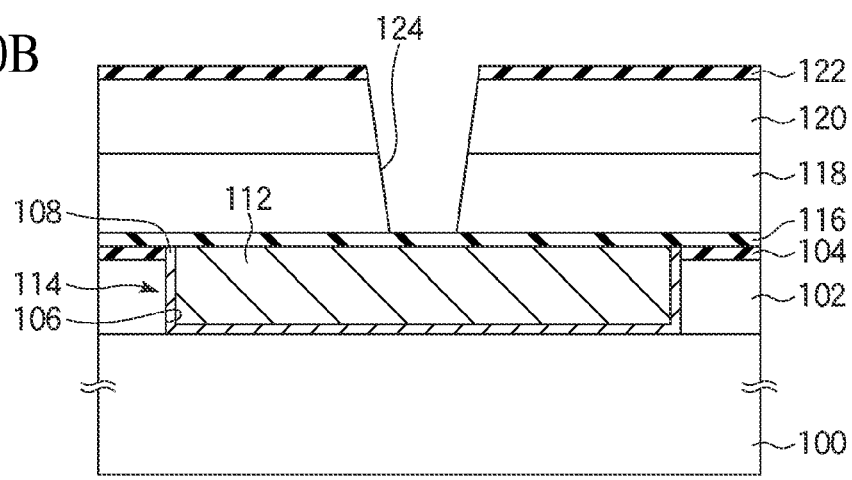
Figure 20C:
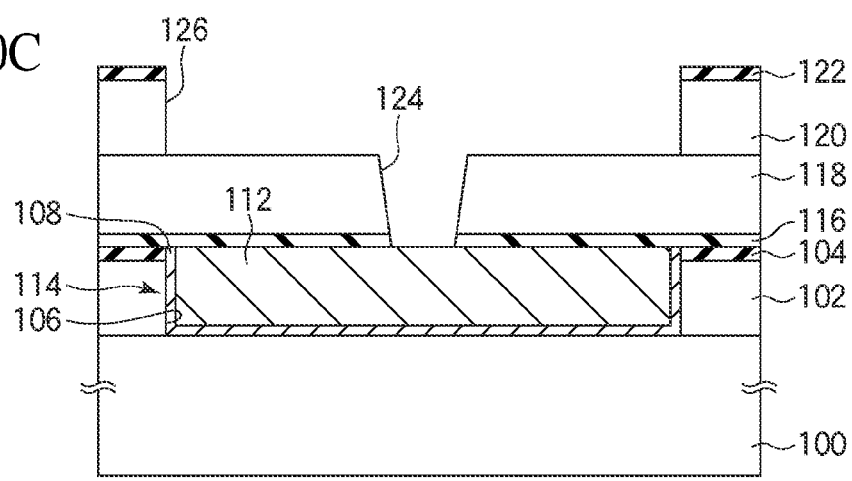

Next, by photolithography and dry etching, a contact hole 124 is formed in the cap film 122, the inter-layer insulation film 120 and the inter-layer insulation film 118 (see FIG. 20B).

Then, by photolithography and dry etching, an interconnection trench 126 is formed in the cap film 122 and the inter-layer insulation film 120, the interconnection trench 126 being in contact with the contact hole 124 at the top of the contact hole 124. Concurrently therewith, the barrier insulation film 116 on the interconnection 114 is removed to cause the contact hole 124 to reach the interconnection 114 (see FIG. 20C).

Figure 21A:
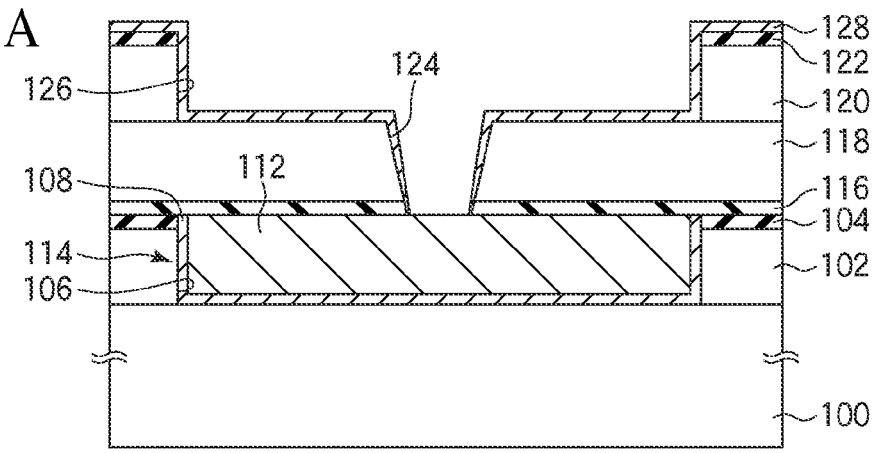
FIGS. 21A to 21C are sectional views of the semiconductor device in the steps of the method for manufacturing the semiconductor device (Part 1), which illustrate the method (Part 4)

Then, a barrier film 128 of a Ta-based material is formed by sputtering on the side surface (or the bottom surface and the side surface) of the contact hole 124, on the bottom surface and the side surface of the interconnection trench 126 and on the cap film 122 (see FIG. 21A). As the barrier metal film 128 of a Ta-based material, the layer film of a Ta film, a TaN film or the layer film of a Ta film and a TaN film is formed. The barrier metal film 128 is for preventing the diffusion of the Cu of a conductor plug 134 and an interconnection 136 which will be described later into the inter-layer insulation film.

Figure 21B:
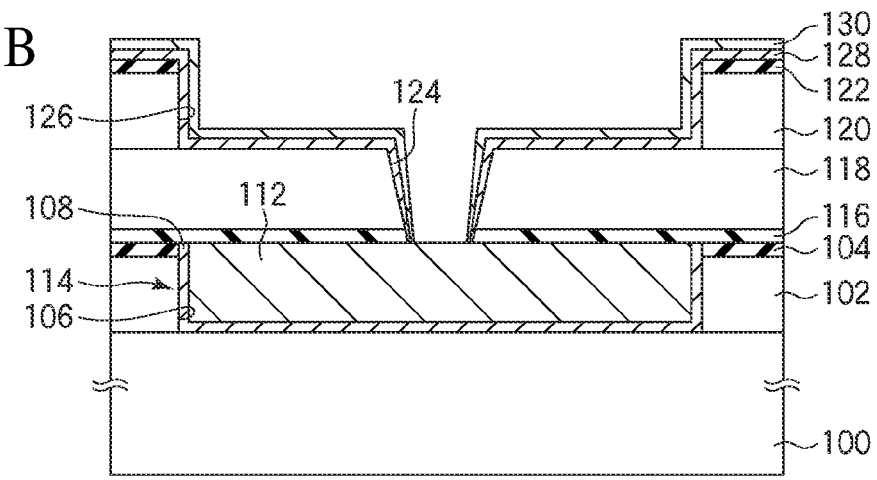
Figure 21C:
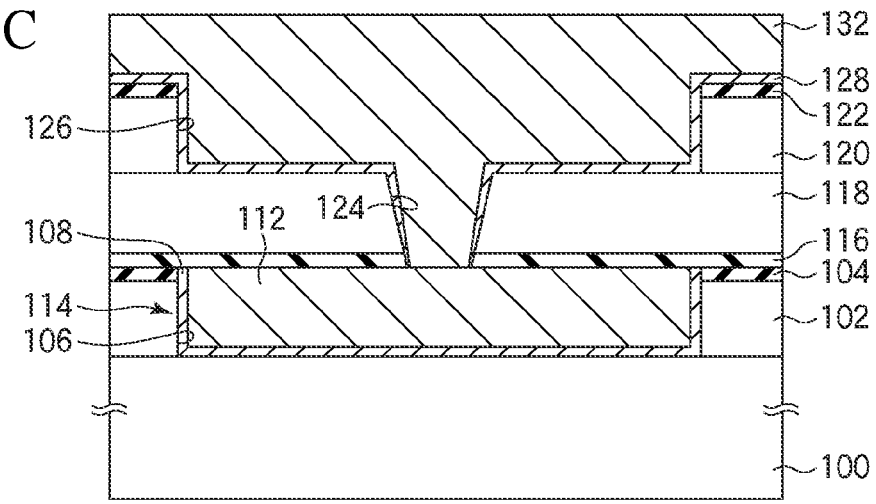

Then, on the barrier metal film 128, a seed film 130 of Cu film is formed by sputtering (see FIG. 21B). The seed film 130 functions as the electrode in forming the Cu film 132 by electroplating.

Next, a Cu film 132 is formed on the seed film 130 by electroplating. Thus, the interconnection trench 126 and the contact hole 124 are filled by the Cu film 132 (see FIG. 21C).

Next, the Cu film 132 and the barrier metal film 128 are polished by CMP until the surface of the cap film 122 is exposed. Thus, by dual damascene, the conductor plug 134 of Cu is buried in the contact hole 124, and the interconnection 136 of Cu is buried in the interconnection trench 126 (see FIG. 22A). The conductor plug 134 and the interconnection 136 are formed integral with each other.

Figure 22A:
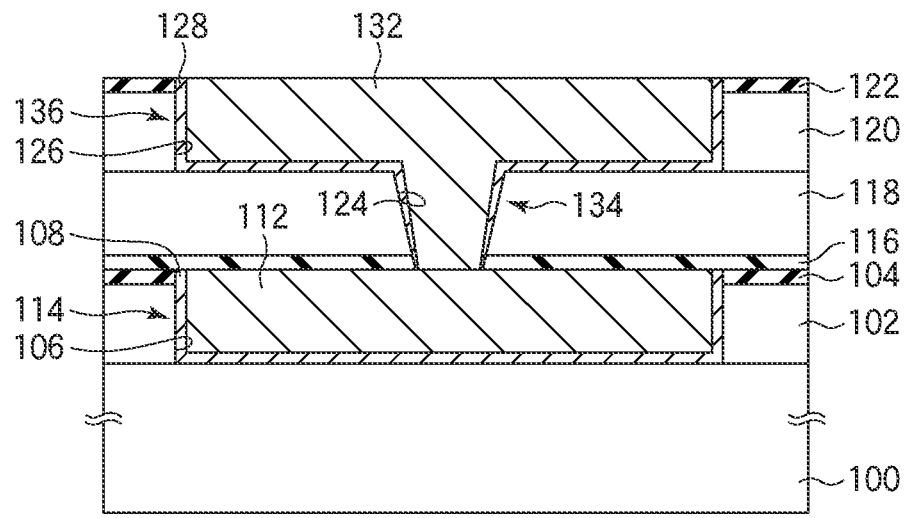
FIGS. 22A and 22B are sectional views of the semiconductor device in the steps of the method for manufacturing the semiconductor device (Part 1), which illustrate the method (Part 5)
Figure 22B:
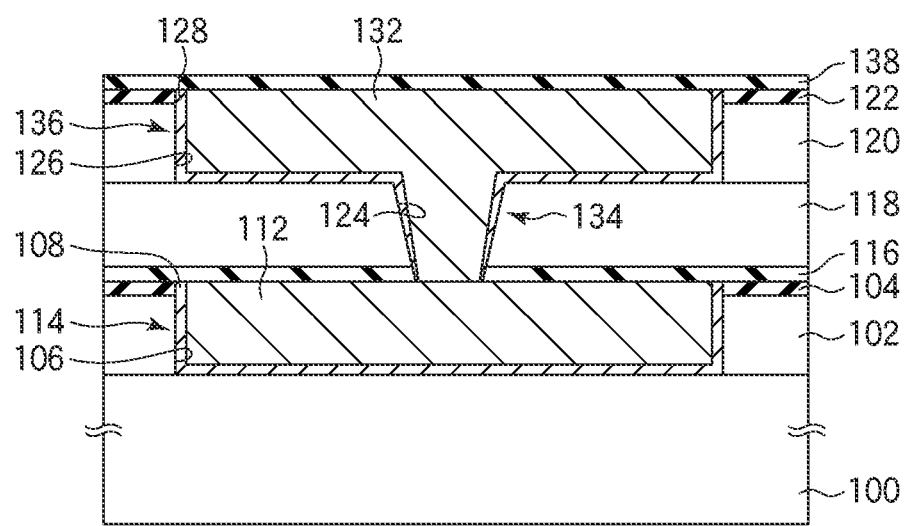

Then, a barrier insulation film 138 is formed on the interconnection 136 and the cap film 122 (see FIG. 22B). The barrier insulation film 138 is for preventing the diffusion of the Cu of the conductor plug 134 and the interconnection 136 into the inter-layer insulation film.

In the thus formed interconnection structure, low dielectric constant insulation film, more specifically, porous low dielectric constant insulation film used as the inter-layer insulation films can be apt to absorb water when damaged with dry etching for forming the interconnection trenches and the contact holes. When the barrier metal film of Ta-based material as described above, the phenomenon that the interfaces of the barrier metal films and the interconnections of Cu are oxidized with water accumulated in the low dielectric constant insulation films takes place. Resultantly, the electro-migration resistance of the interconnections of Cu degrades.

As a technique for realizing good electro-migration resistance when low dielectric constant insulation film is used as the inter-layer insulation films, the technique of using barrier metal films of titanium (Ti) can be used.

When the barrier metal films of Ti are used, the interfaces between the barrier metal films and the interconnections of Cu are not easily oxidized, etc., good electro-migration resistance can be obtained. On the other hand, when heat of about 350-450° C. is applied after the Cu film to be the interconnection has been formed, the Ti of the barrier metal film is diffused into the Cu film, and the interconnection resistance rises.

To realize good electro-migration resistance when the barrier metal film of a Ta-based material, the technique of forming an interface layer containing silicon (Si) in the interface of the interconnections of Cu and the barrier insulation film can be used.

A method for manufacturing the semiconductor device (Part 2) will be explained with reference to FIGS. 23A and 23B.

Figure 23A:
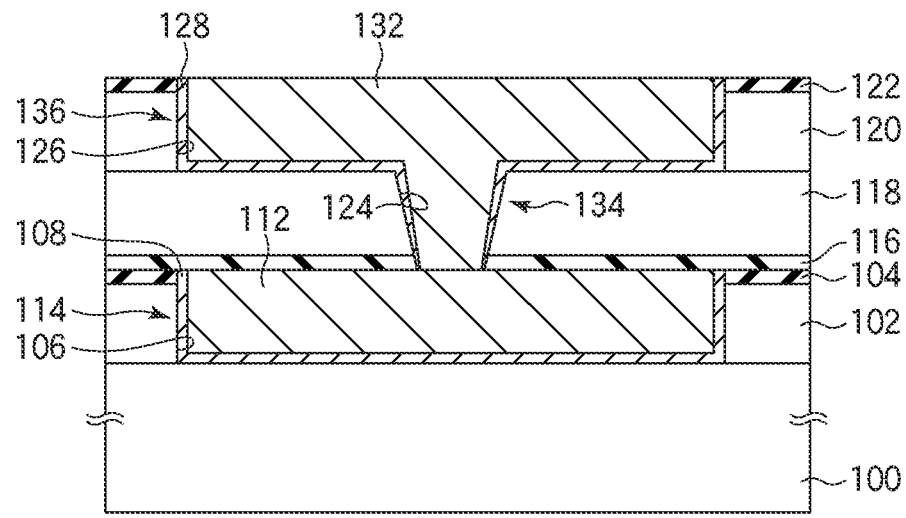
FIGS. 23A and 23B are sectional views of the semiconductor device in the steps of the method for manufacturing the semiconductor device (Part 2), which illustrate the method.

First, in the same way as in the semiconductor device manufacturing method illustrated in FIGS. 18A to 22B, the semiconductor device up to the interconnection 136 of Cu buried in the interconnection trench 126 is formed (see FIG. 23A).

Next, before the barrier insulation film 138 is formed, the surface of the interconnection 136 is exposed to silane gas.

Figure 23B:
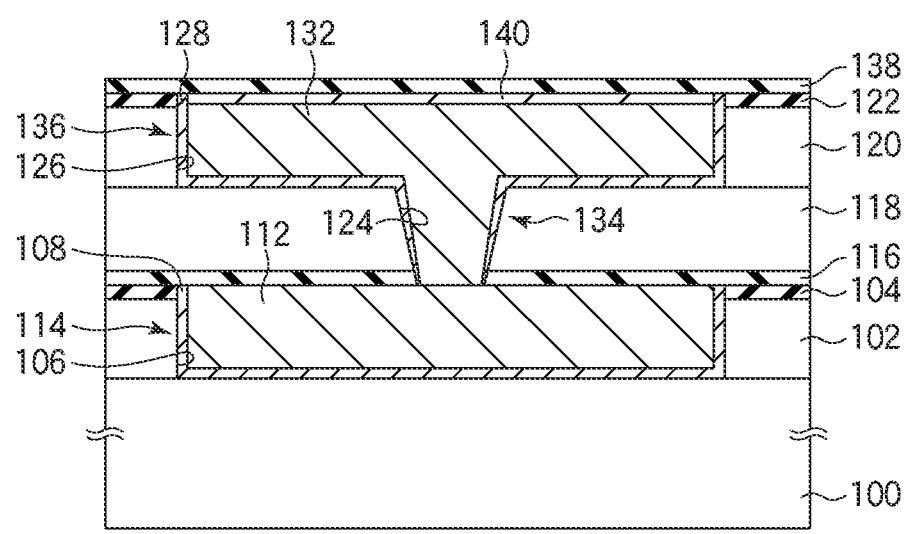

Then, a barrier insulation film 138 is formed on the interconnection 136 and the cap film 122 (see FIG. 23B).

Thus, the surface of the interconnection 136 is exposed to silane gas before the barrier insulation film 138 is formed, whereby, as illustrated in FIG. 23B, an interface layer 140 containing Si is formed on the surface of the interconnection 136. Also on the interconnection 114, which is the first layer, an Si-content interface layer may be formed in the same way as the interface layer on the interconnection 136, which is the second layer.

Figure 24A:
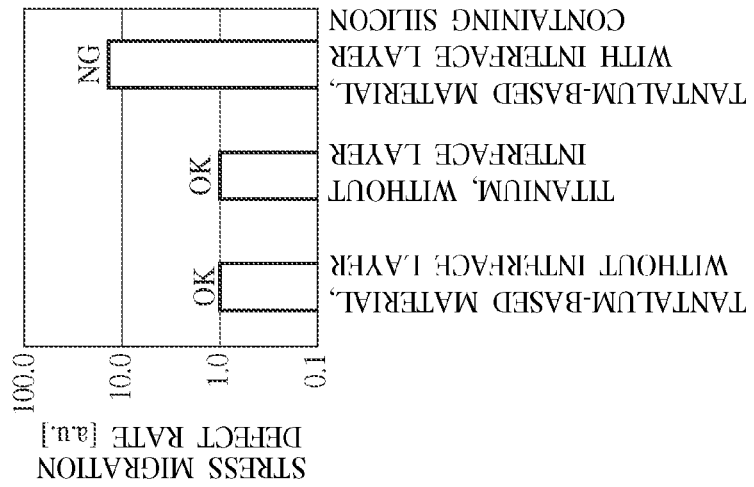
FIGS. 24A to 24C are graphs, for comparison, of characteristics of the Cu interconnections.
Figure 24B:
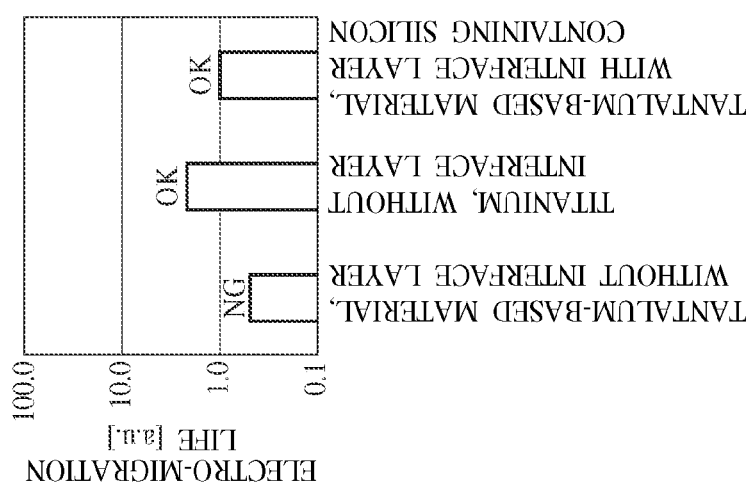
Figure 24C:
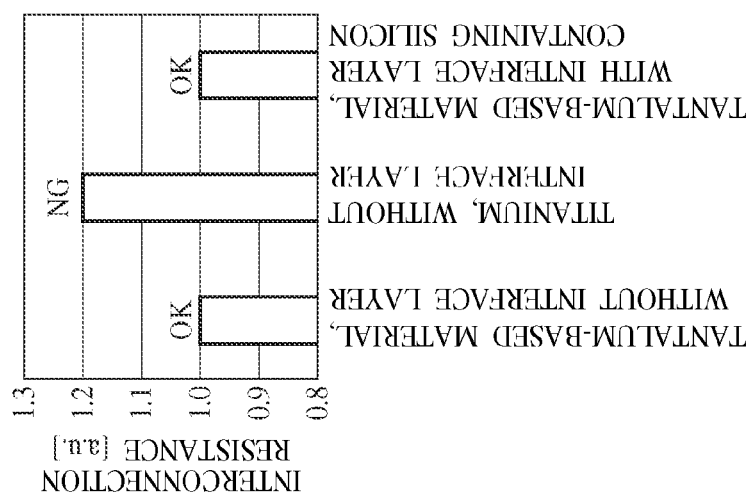

FIGS. 24A to 24C are graphs of characteristics of the Cu interconnections for comparison. In FIG. 24A, the Cu interconnection illustrated in FIGS. 18A to 22B with the barrier metal film of the Ta-based material formed, the Cu interconnection with the barrier metal film of Ti formed, the interconnection with the barrier metal film of a Ta-based material formed and the interface layer containing Si formed on the surface of the interconnection illustrated in FIGS. 23A and 23B were compared in the interconnection resistance. In FIG. 24B, the three cases were compared in the electro-migration lifetime. In FIG. 24C, the three cases were compared in the stress migration defect rate.

The electro-migration lifetime was evaluated by the electro-migration test in which current of a 2.5 MA/cm$^2$ current density was flowed at 250° C. The stress migration defect rate was evaluated by the stress migration test in which 200° C. was held for 504 hours.

In the case using the barrier metal film of the Ta-based material illustrated in FIGS. 18A to 22B, as illustrated in FIG. 24B, the electro-migration resistance degrades.

In contrast to this, in the base using the barrier metal film of Ti, as illustrated in FIG. 24B, the electro-migration resistance is good. The interconnection resistance, however, largely rose as illustrated in FIG. 24A.

In the case using the barrier metal film of the Ta-based material and with the interface layer containing Si formed on the surface of the interconnection illustrated in FIGS. 23A and 23B, as illustrated in FIG. 24A, the interconnection resistance is retained low. As illustrated in FIG. 24B, the electro-migration resistance is also good. However, as illustrated in FIG. 24C, the stress migration resistance degrades. In this case, the degradation of the stress migration resistance will due to the processing of the exposure to silane gas for forming the Si-content interface layer. That is, when the surface of the interconnection of Cu is exposed to a reducing gas, such as silane gas or others, the Cu of the interconnection is more likely diffused and increase concavities and convexities in the surface of the interconnection. When the barrier film of a Ta-based material is used, due to poor close contact between the Ta and the Cu, concavities and convexities especially in the interconnection surface tend to increase. The concavities and convexities in the thus formed interconnection surface will be sites for forming cores of voids which induce the stress migration, which will be a factor for the degradation of the stress migration resistance.

As described above, the above-described techniques cannot retain the interconnection resistance low and/or cannot make both of the electro-migration resistance and the stress migration resistance good enough.

Preferred embodiments of the present invention will be explained with reference to accompanying drawings.

[a] First Embodiment

The semiconductor device according to a first embodiment and the method for manufacturing the semiconductor device will be explained with reference to FIGS. 1 to 16C.

(Semiconductor Device)

Figure 1:
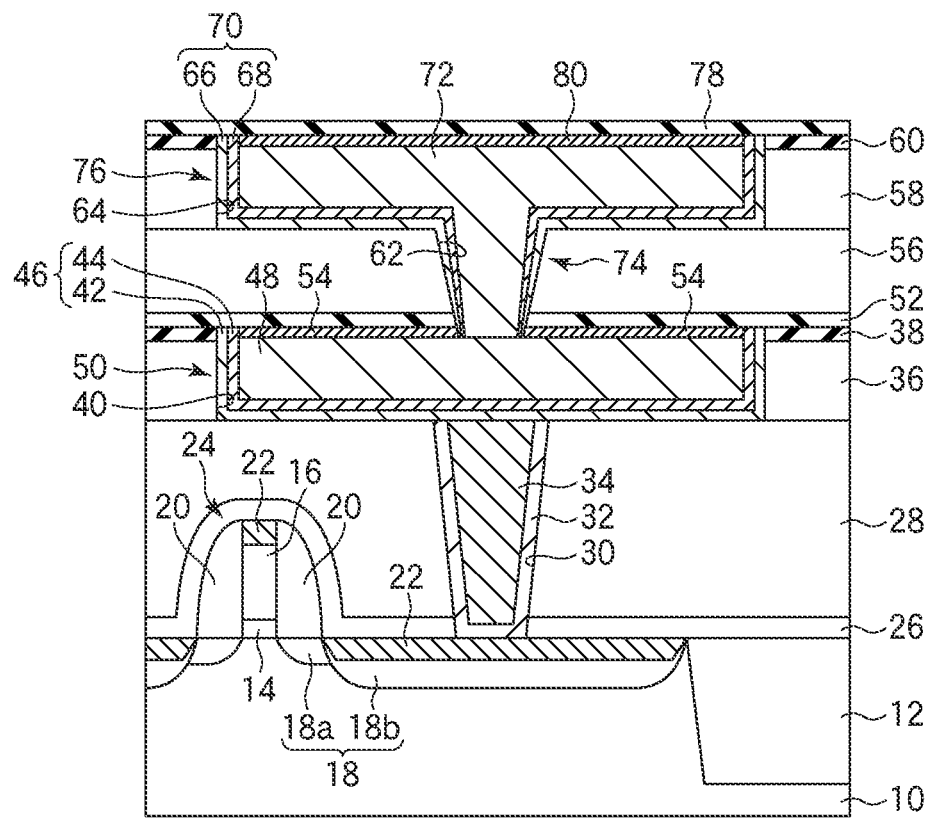
FIG. 1 is a sectional view of the semiconductor device according to a first embodiment.

First, the semiconductor device according to the present embodiment will be explained with reference to FIG. 1. FIG. 1 is a sectional view of the semiconductor device according to the present embodiment, which illustrates the structure thereof.

As illustrated in FIG. 1, on a semiconductor substrate 10 of, e.g., silicon, device isolation regions 12 for defining device regions are formed.

On each device region defined by the device isolation region 12, a gate electrode 16 is formed with a gate insulation film 14 formed therebetween.

In the semiconductor substrate 10 on both side of the gate electrode 16, impurity diffused regions 18a forming the shallow regions of an extension source/drain structure, i.e., the extension regions are formed.

On the side wall of the gate electrode 16, a sidewall insulation film 20 of silicon oxide film is formed.

In the semiconductor substrate 10 on both sides of the gate electrode 16 with the sidewall insulation film formed on, impurity diffused regions 18b forming the deep regions of the extension source/drain structure are formed. The shallow impurity diffused regions 18a and the deep impurity diffused regions 18b form the source/drain diffused layer 18 of the extension source/drain structure.

On the gate electrode 16 and on the source/drain diffused layer 18, a metal silicide film 22 of, e.g., nickel silicide is formed.

Thus, transistors 24 each including the gate electrode 16 and the source/drain diffused layer 18 are formed.

On the semiconductor substrate 10 with the transistors 24 formed on, an insulation film 26 of, e.g. silicon nitride film is formed.

On the insulation film 26, an insulation film 28 of, e.g., silicon oxide film is formed.

In the insulation films 28, 26, contact holes 30 are formed down to the source/drain diffused layer 18.

In the contact holes 30, a barrier metal film 32 of, e.g. titanium nitride (TiN) is formed.

In each contact hole 30 with the barrier metal film 32 formed in, a conductor plug 34 of, e.g., tungsten is buried.

On the insulation film 28 with the conductor plug 34 buried in, an inter-layer insulation film 36 of low dielectric constant insulation film is formed. As the inter-layer insulation film 36, a coating-type porous low dielectric constant insulation film is used. In the present specification, the low dielectric constant insulation film means an insulation film whose relative dielectric constant is lower than silicon oxide film, i.e., an insulation film whose relative dielectric constant is smaller than 4.

On the inter-layer insulation film 36, a cap film 38 of, e.g., SiN film or SiC film is formed. The film thickness of the cap film 38 is, e.g., about 10-100 nm.

In the cap film 38 and the inter-layer insulation film 36, interconnection trenches 40 connected to the conductor plugs 34 are formed.

In each interconnection trench 40, i.e., on the side surface and the bottom surface of the interconnection trench 40, a Ti film 42 is formed. The film thickness of the Ti film 42 on the side surface and the bottoms surface of the interconnection trench 40 is, e.g., about 0.5-10 nm.

On the Ti film 42 in the interconnection trench 40, a Ta film 44 is formed. The film thickness of the Ta film on the side surface and the bottom surface of the interconnection trench 40 is, e.g., about 3-20 nm.

Thus, on the side surfaces and the bottom surfaces of the interconnection trenches 40, a barrier metal film 46 of the layer film of the Ti film 42 and the Ta film 44 is formed. The barrier metal film 46 is for preventing the diffusion of the Cu of an interconnection 50 to be described layer into the inter-layer insulation film.

In the interconnection trenches 40 with the barrier metal film 46 formed in, a Cu film 48 is buried.

Thus, in the interconnection trenches 40, interconnections 50 of Cu are buried. The interconnections 50 are connected to the conductor plugs 34.

On the interconnections 50 and the cap film 38, a barrier insulation film 52 of, e.g., SiCN film or SiCO film is formed. The film thickness of the barrier insulation film 52 is, e.g., about 10-100 nm. The barrier insulation film 52 is for preventing the diffusion of the Cu of the interconnections 50 into the inter-layer insulation film.

In the interface between the interconnection 50 and the barrier insulation film 52, i.e., on the surface of the interconnection 50, an interface layer 54 containing Ti and Si is formed. The Ti contained in the interface layer 54 is supplied by diffusing the Ti of the Ti film 42 of the barrier metal film 46 into the surface of the interconnection 50 by heat processing to deposit. The Si contained in the interface layer 54 is supplied by exposing the surface of the interconnection 50 to a silicon content gas, as will be described later. The interface layer 54 may be formed in a continuous film or in islets separated from each other. In the present specification, the interface layer, i.e., the layer containing Ti and Si is not limited to the layer formed in a continuous film and can be the layer formed in islets separated from each other.

On the barrier insulation film 52, an inter-layer insulation film 56 of low dielectric constant insulation film is formed. As the inter-layer insulation film 56, the low dielectric constant insulation film of, e.g., SiOC film is used.

On the inter-layer insulation film 56, an inter-layer insulation film 58 of low dielectric constant insulation film is formed. As the inter-layer insulation film 58, a coating-type porous low dielectric constant insulation film, for example, is used.

On the inter-layer insulation film 58, a cap film 60 of, e.g., SiN film or SiC film is formed. The film thickness of the cap film 60 is, e.g., about 10-100 nm.

In the inter-layer insulation film 56 and the barrier insulation film 52, contact holes 62 are formed down to the interconnections 50.

In the cap film 60 and the inter-layer insulation film 58, interconnection trenches 64 are formed, connected to the tops of the contact holes 62.

In the contact holes 62 and in the interconnection trenches 64, i.e., on the side surfaces of the contact holes 62 and on the side surfaces and the bottom surfaces of the interconnection trenches 64, a Ti film 66 is formed. The film thickness of the Ti film 66 on the side surfaces and the bottom surfaces of the interconnection trenches 64 is, e.g., about 0.5-10 nm.

On the Ti film 66 in the contact holes 62 and the interconnection trenches 64, a Ta film 68 is formed. The film thickness of the Ta film 68 on the side surfaces and the bottom surfaces of the interconnection trenches 64 is, e.g., about 3-20 nm.

Thus, on the side surfaces of the contact holes 62 and on the side surfaces and the bottom surfaces of the interconnection trenches 64, a barrier film 70 of the layer film of the Ti film 66 and the Ta film 68 is formed. The barrier metal film 70 is for preventing the diffusion of the Cu of conductor plugs 74 and interconnections 76 which will be described later into the inter-layer insulation films. As will be described later, as the conditions for forming the Ta film 68 by sputtering, conditions which simultaneously advancing the deposition and the etching are used. To this end, the barrier metal film 70 is not formed on the bottoms of the contact holes 62. Thus, the interconnections 50 and the conductor plugs 74 can have good contact.

Thus, in the contact holes 62 and the interconnection trenches 64 with the barrier metal film 70 formed in, a Cu film 72 is buried.

Thus, the conductor plugs 74 of Cu are buried in the contact holes 62, and the interconnections 76 of Cu are buried in the interconnection trenches 64. The conductor plugs 74 and the interconnections 76 are formed integral with each other. The interconnections 76 are electrically connected to the interconnections via the conductor plugs 74.

On the interconnections 76 and the cap film 60, a barrier insulation film 78 of, e.g., SiCN film or SiCO film is formed. The barrier insulation film 78 is for preventing the diffusion of the Cu of the conductor plugs and the interconnections 76 into the inter-layer insulation film.

A interface layer 80 containing Ti and Si is formed in the interfaces between the interconnections 76 and the barrier insulation film 78, i.e., on the surfaces of the interconnections 76. The Ti contained in the interface layer 80 is supplied by diffusing the Ti of the Ti film 66 of the barrier metal film 70 into the surfaces of the interconnections 76 by thermal processing to deposit. The Si contained in the interface layer 80 is supplied by exposing the surfaces of the interconnections 76 to a silicon-content gas. The interface layer 80 may be formed in a continuous film or in islets separated from each other.

On the barrier insulation film 78, interconnections not illustrated are further formed.

Thus, the semiconductor device according to the present embodiment, including the interconnections 50, 76 of Cu is constituted.

As described above, the semiconductor device according to the present embodiment includes the barrier metal films 46, 70 of the layer film of Ti film and Ta film, and the interface layers 54, 80 containing Ti and Si are formed on the surface of the interconnections 50, 78 of Cu.

In the present embodiment, the interface layers 54, 80 containing Ti and Si, which are formed on the surfaces of the interconnections 50, 76 can improve the adhesion between the interconnections 50, 76 and the barrier insulation films 52, 78. Because of the barrier metal films 46, 70 formed of the layer film of Ti film and Ta film, the concentration of the Ti diffused in the interconnections 50, 76 of Cu can be suppressed low. Resultantly, according to the present embodiment, the interconnection resistance of the interconnections 50, 76 of Cu can be retained low, and the stress migration resistance can be largely improved without degrading the electro-migration resistance.

(Method for Manufacturing the Semiconductor Device)

Next, the method for manufacturing the semiconductor device according to the present embodiment will be explained with reference to FIGS. 2A to 11B. FIGS. 2A to 11B are sectional views of the semiconductor device according to the present embodiment in the steps of the method for manufacturing the semiconductor device, which illustrate the method.

For example, in the semiconductor substrate 10 of, e.g., silicon, N-type wells and P-type wells (either not illustrated) are suitably formed. As the semiconductor substrate 10, a (100) P-type silicon substrate is used.

Next, in the semiconductor substrate 10, the device isolation regions 12 for defining the device regions are formed by, e.g., STI (Shallow Trench Isolation). When the device isolation regions 12 are formed by STI, the trenches for the device isolation are formed in the semiconductor substrate 10 by dry etching. Next, the trenches are filled with insulation film by CVD (Chemical Vapor Deposition). Then, the buried insulation film in the trenches is planarized by CMP to form the device isolation regions 12 of insulation film.

Next, by, e.g., ion implantation, a dopant impurity for the channels is implanted into the semiconductor substrate 10, and then thermal processing for activating the implanted dopant impurity is made.

Next, the gate insulation film 14 is formed on the entire surface by, e.g., CVD.

Next, a polysilicon film 16 is formed on the entire surface by, e.g., CVD. Then, a dopant impurity is implanted into the polysilicon film 16 by, e.g., ion implantation.

Figure 2A:
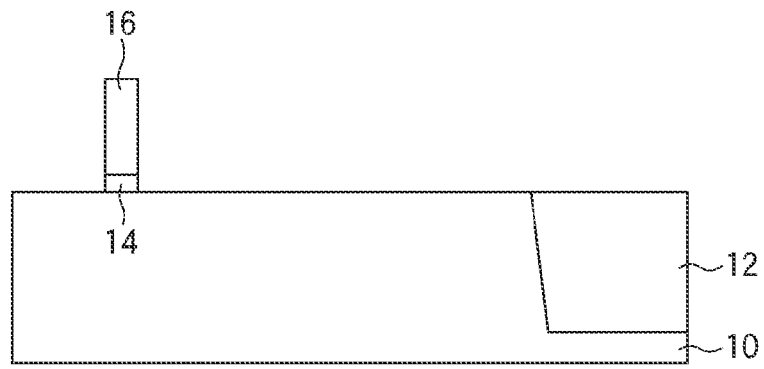
FIGS. 2A to 2C are sectional views of the semiconductor device according to the first embodiment in the steps of the method for manufacturing the semiconductor device, which illustrate the method (Part 1)

Next, by photolithography and dry etching, the polysilicon film 16 is patterned to form the gate electrodes 16 of the polysilicon film (see FIG. 2A).

Then, by ion implantation, a dopant impurity is implanted into the semiconductor substrate 10 on both sides of the gate electrode 16 with the gate electrode 16 as the mask. Thus, in the semiconductor substrate 10 on both sides of the gate electrode 16, the impurity diffused regions 18a forming the shallow regions of the extension source/drain structure, i.e., the extension regions (see FIG. 2B).

Next, a silicon oxide film 20 is formed on the entire surface by, e.g., CVD and the silicon oxide film 20 is anisotropically etched by dry etching. Thus, the sidewall insulation film 20 of the silicon oxide film is formed on the sidewalls of the gate electrodes 16 (see FIG. 2C).

Next, by, e.g., ion implantation, a dopant impurity is implanted into the semiconductor substrate 10 with the gate electrodes 16 and the sidewall insulation film 20 as a mask. Thus, in the semiconductor substrate 10 on both sides of each gate electrode 16 with the sidewall insulation film 20 formed on the side wall, the impurity diffused regions 18b forming the deep regions of the extension source/drain structure are formed. The shallow impurity diffused regions 18a and the deep impurity diffused regions 18b form the source/drain diffused layer 18 of the extension source/drain structure (see FIG. 3A).

Then, thermal processing for activating the dopant impurities implanted into the gate electrodes 16 and the source/drain diffused layer 18.

Thus, the transistors 24 including the gate electrode 16 and the source/drain diffused layer 18 are formed.

Then, by, e.g., hydrogen fluoride processing, a natural oxide film formed on the surfaces of the gate electrodes 16 and the source/drain diffused layer 18 is removed.

Next, on the entire surface, nickel (Ni) film (not illustrated) containing platinum (Pt) is formed by, e.g., PVD (Physical Vapor Deposition).

Next, a cap film (not illustrated) of TiN film is formed on the entire surface by, e.g., PVD.

Next, as the first thermal processing for silicidation, thermal processing is made by, e.g., RTA (Rapid Thermal Annealing).

Next, by wet etching using the mixed liquid of, e.g., sulfuric acid and hydrogen peroxide liquid, the Ni film on the cap film and the insulation film, which has not reacted is selectively removed.

Next, as the second thermal processing of silicidation, thermal processing is made by, e.g., RTA.

Figure 2B:
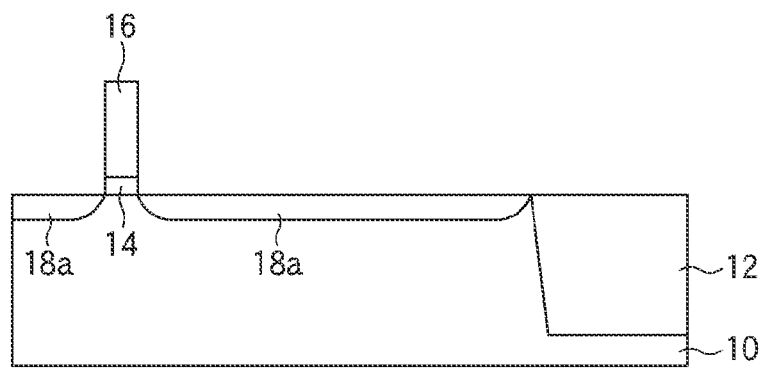
Figure 2C:
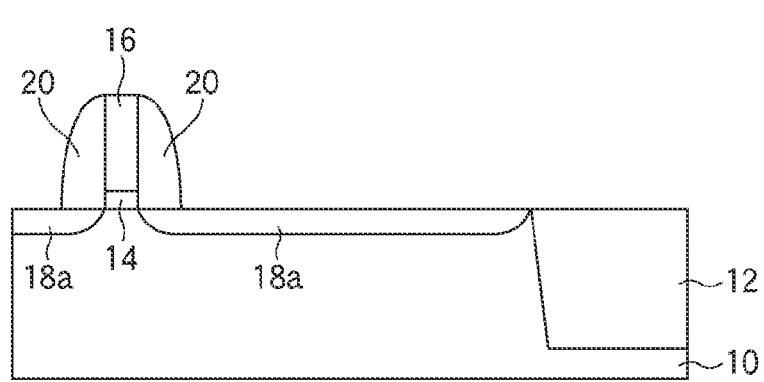

Thus, by SALISIDE (Self-aligned silicide) process, the metal silicide film 22 of nickel silicide film is formed on the tops of the gate electrodes 16 and the tops of the source/drain diffused layers 18 (see FIG. 2B).

Then, on the entire surface, the insulation film 26 of silicon nitride film is formed by, e.g., plasma CVD.

Next, on the entire surface, the insulation film 28 of silicon oxide film is formed by, e.g., plasma CVD.

Figure 3A:
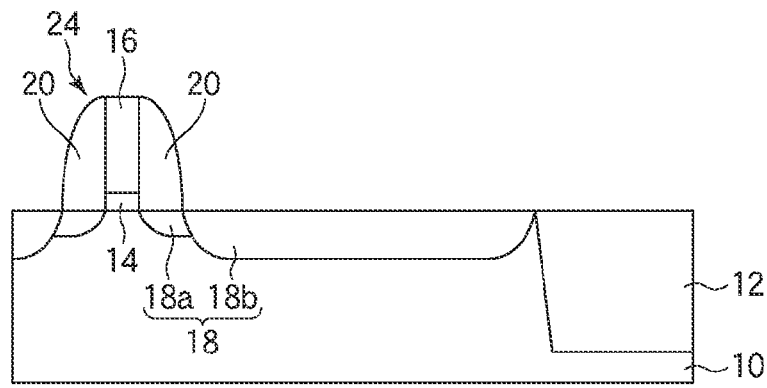
FIGS. 3A to 3C are sectional views of the semiconductor device according to the first embodiment in the steps of the method for manufacturing the semiconductor device, which illustrate the method (Part 2)
Figure 3B:
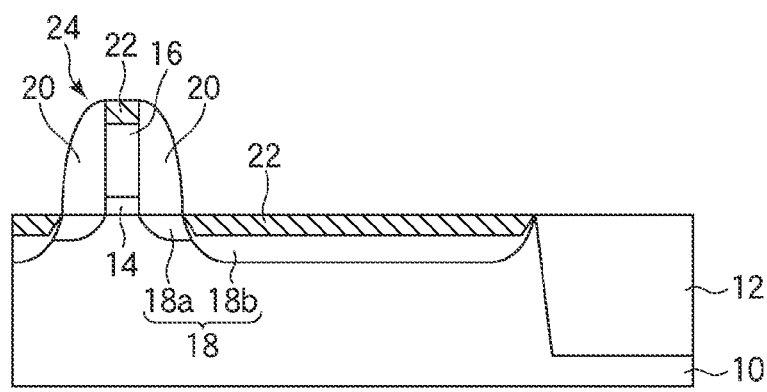
Figure 3C:
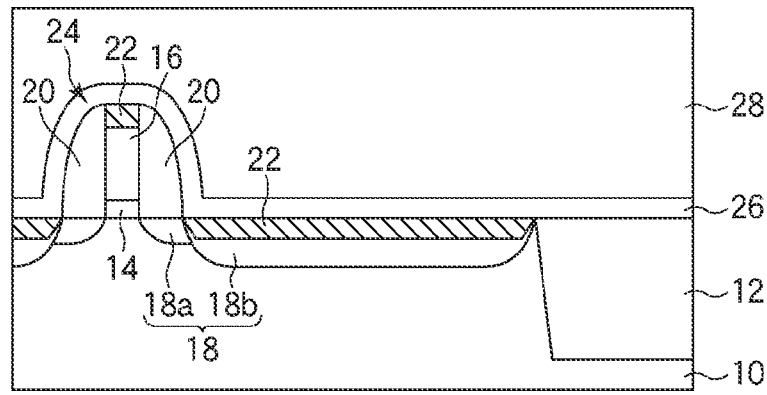

Next, the insulation film 28 is polished by, e.g., CMP, and the insulation film 28 is planarized (see FIG. 3C).

Figure 4A:
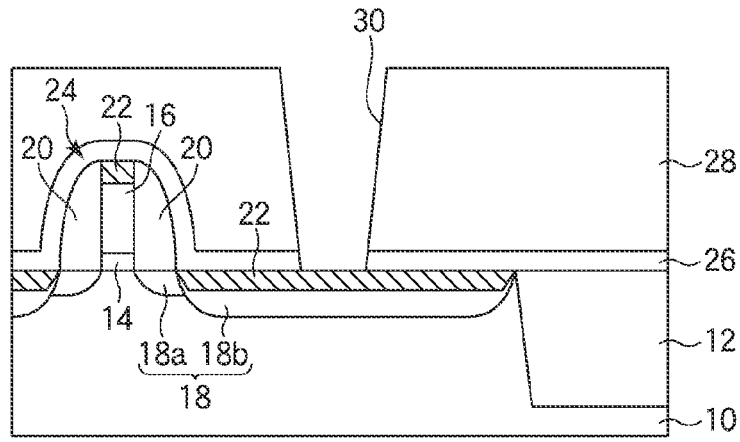
FIGS. 4A to 4C are sectional views of the semiconductor device according to the first embodiment in the steps of the method for manufacturing the semiconductor device, which illustrate the method (Part 3)
Figure 4B:
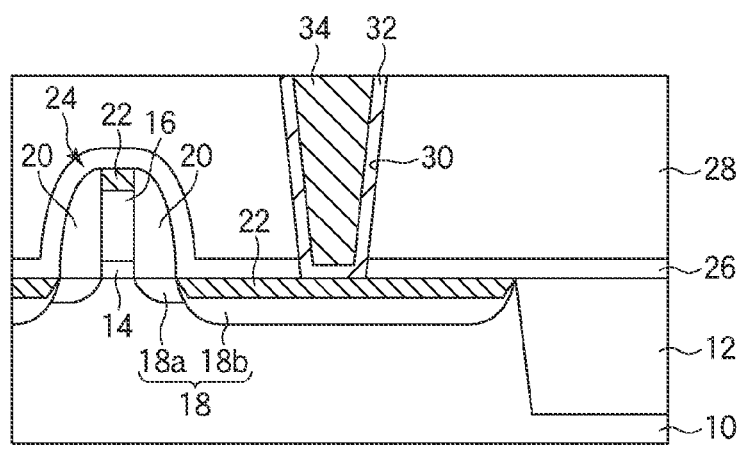

Next, by photolithography and dry etching, the contact holes 30 are formed in the insulation films 28, 26 down to the source/drain diffused layer 18 (see FIG. 4A).

Next, on the entire surface, the barrier metal film 32 of, e.g., TiN film is formed by, e.g., PVD.

Then, on the entire surface a tungsten film 34, for example, is formed by, e.g., CVD.

Next, by, e.g., CMP, the tungsten film 34 and the barrier metal film 32 are polished until the surface of the insulation film 28 is exposed. Thus, the conductor plugs 34 of the tungsten film are buried in the contact holes 30 (see FIG. 4B).

Next, on the insulation film 28 with the conductor plugs 34 buried in, the inter-layer insulation film of low dielectric constant insulation film is formed. As the inter-layer insulation film 36, a coating-type porous low dielectric constant insulation film is formed.

Figure 4C:
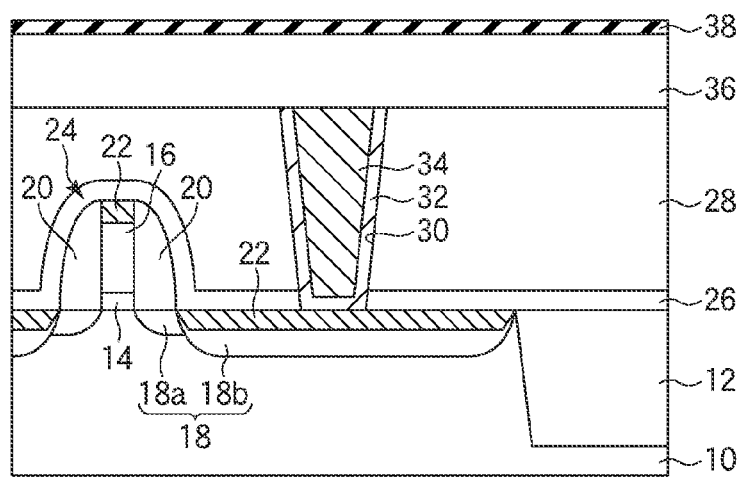

Next, on the entire surface, the cap film 38 of SiN film or SiC film is formed by, e.g., CVD (see FIG. 4C). The film thickness of the cap film 38 is, e.g., about 10-100 nm.

Figure 5A:
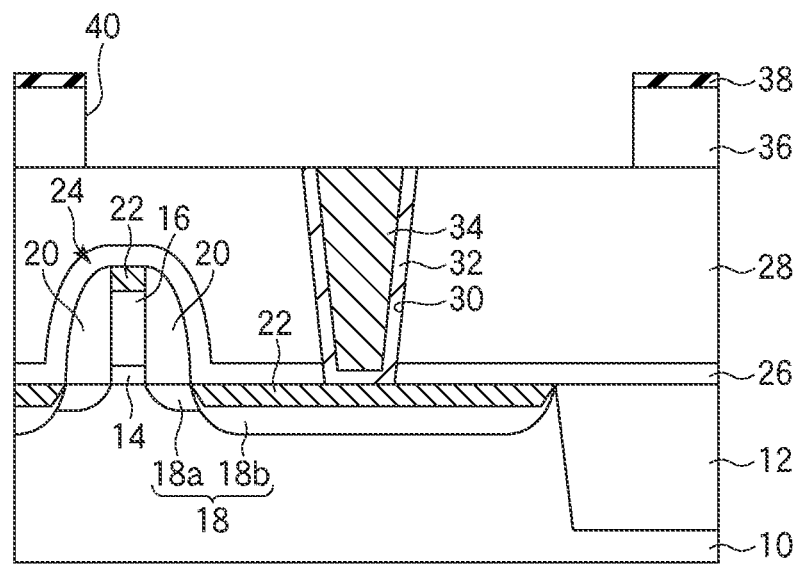
FIGS. 5A and 5B are sectional views of the semiconductor device according to the first embodiment in the steps of the method for manufacturing the semiconductor device, which illustrate the method (Part 4)

Next, by photolithography and dry etching, the interconnection trenches 40 are formed in the cap film 38 and the inter-layer insulation film 36, connected to the conductor plugs 34 (see FIG. 5A).

Next, on the side walls and the bottom surfaces of the interconnection trenches 40 and on the cap film 38, a Ti film 42 is formed by, e.g., long-throw sputtering. The film thickness of the Ti film 42 is, e.g., about 0.5-10 nm. The conditions for forming the Ti film 42 are as exemplified below. The target electric power is, e.g., 0.5-18 kW. The substrate bias is, e.g., 0-500 W. Under these conditions, the Ti film 42 is formed so the Ti film 42 on the cap film 38 can have a 10 nm-film thickness. At this time, the film thickness of the Ti film 42 on the side surfaces and the bottom surfaces of the interconnection trenches 40 becomes about 1.0 nm.

To improve the efficiency of diffusing the Ti of the Ti film 42 into the surfaces of the interconnections 50 to deposit, it is preferable to form the Ti film 42 on the side surfaces and the bottom surfaces of the interconnection trenches 40 having parts whose film thickness is at least 0.5 nm or above.

Then, on the Ti film 42, a Ta film 44 is formed by, e.g., long-throw sputtering. The film thickness of the Ta film 44 is about, e.g., 3-20 nm. The conditions for forming the Ta film 44 are as exemplified below. The target electric power is, e.g., 1-18 kW. The substrate bias is, e.g., 0 W. The Ta film 44 may be formed by two-steps sputtering in the same way as a Ta film 68 to be described later is formed.

Figure 5B:
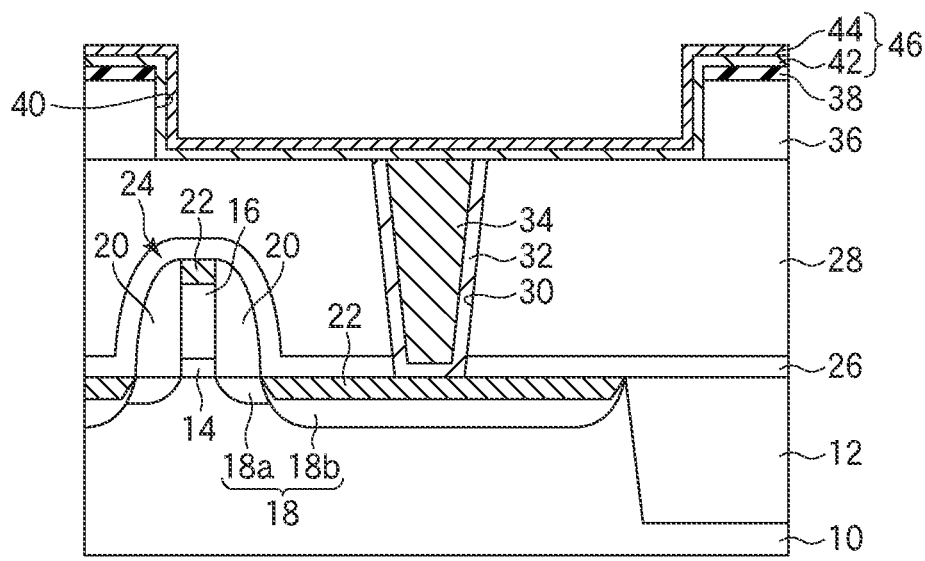

Thus, on the side surfaces and the bottom surfaces of the interconnection trenches 40 and on the cap film 38, the barrier metal film 46 of the layer film of a Ti film 42 and a Ta film 44 is formed (see FIG. 5B).

Figure 6A:
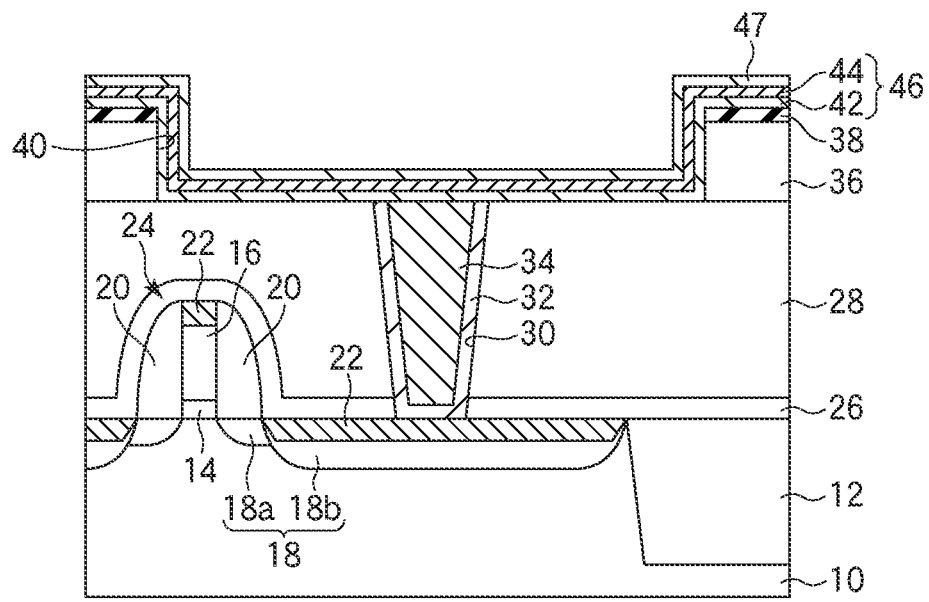
FIGS. 6A and 6B are sectional views of the semiconductor device according to the first embodiment in the steps of the method for manufacturing the semiconductor device, which illustrate the method (Part 5)
Figure 6B:
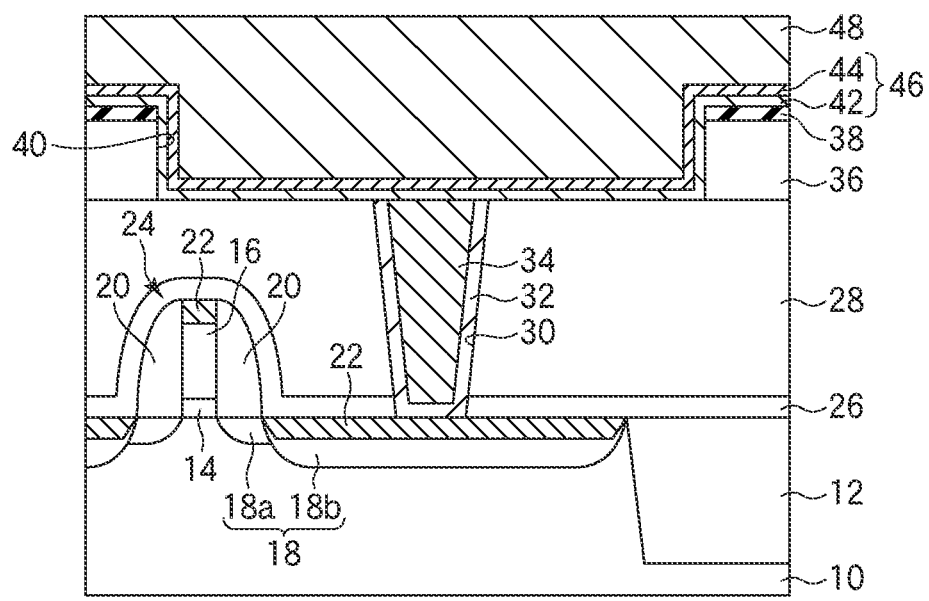

Then, on the barrier metal film 46, the seed film 47 of Cu film is formed by, e.g., sputtering (see FIG. 6A). The film thickness of the seed film 47 is, e.g., about 10-300 nm. The seed film 47 functions as the electrode in forming the Cu film 48 by electroplating.

Next, the Cu film 48 is formed on the entire surface by electroplating. The thickness of the Cu film is, e.g., about 100-1500 nm. Thus, the interconnection trenches 40 are filled with the Cu film (see FIG. 6B).

Next, by CMP the Cu film 48 and the barrier metal film 46 are polished until the surface of the cap film 38 is exposed to planarized the Cu film 48. Thus, the interconnections 50 of Cu are buried in the interconnection trenches 40 (see FIG. 7A).

Then, thermal processing is made to diffuse the Ti of the Ti film 42 into the surface of the interconnections 50 to deposit. The thermal processing temperature is, e.g., about 256-450° C. The thermal processing period of time is, e.g., about 1 second to 30 minutes, specifically about 10 seconds. This thermal processing may be made, e.g., in vacuum, or hydrogen gas, ammonium gas, argon gas, helium gas, nitrogen gas or a mixed gas of these gases. Furthermore, the thermal processing may be made while plasma processing is being made on the surfaces of the interconnections 50 and the cap film 38. The plasma processing may be made before or after the thermal processing. The plasma processing uses a plasma atmosphere generated by using, e.g., hydrogen gas, ammonium gas, argon gas, helium gas, nitrogen gas or a mixed gas of these gases.

The diffusion of the Ti into the surfaces of the interconnections 50 and the deposition can be advanced also by heat applied in later steps, and the thermal processing for diffusing the Ti of the Ti film 42 into the surfaces of the interconnections 50 to deposit may not be made essentially independently.

Next, silylation processing for exposing the surfaces of the interconnections 50 to a silicon-content gas is made. The processing conditions for the silylation processing are as exemplified below. The silicon-content gas is silane ($SiH_4$) gas. The processing temperature is about 256-450° C. The processing pressure is about 0.1-10 Torr. The processing period of time is about 1 second to 3 minutes.

Before or after the silylation processing, plasma processing may be made to the surfaces of the interconnections 50 and the cap film 38. For the plasma processing, a plasma atmosphere generated by using, hydrogen gas, ammonium gas, argon gas, helium gas, nitrogen gas or a mixed gas of there gases is used.

Figure 7A:
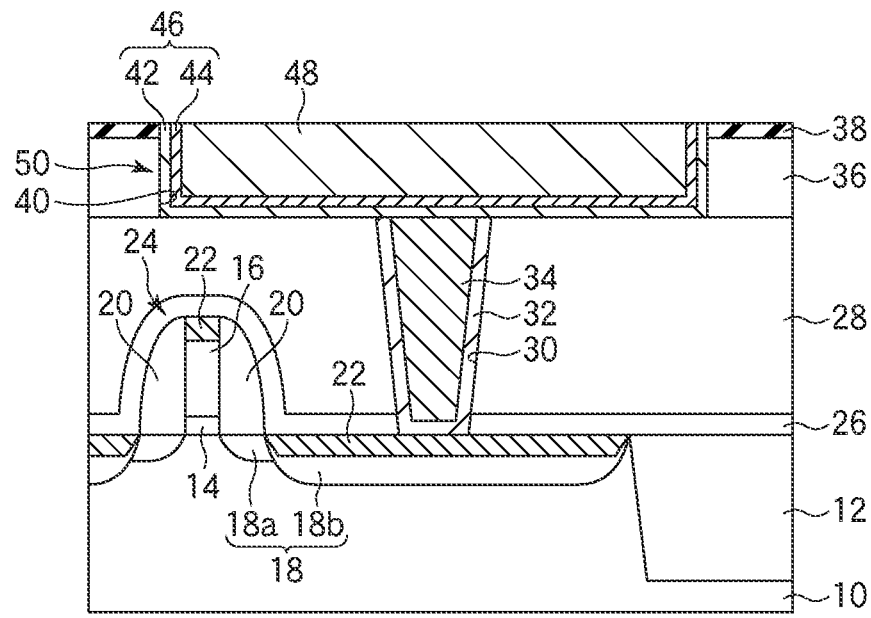
FIGS. 7A and 7B are sectional views of the semiconductor device according to the first embodiment in the steps of the method for manufacturing the semiconductor device, which illustrate the method (Part 6)
Figure 7B:
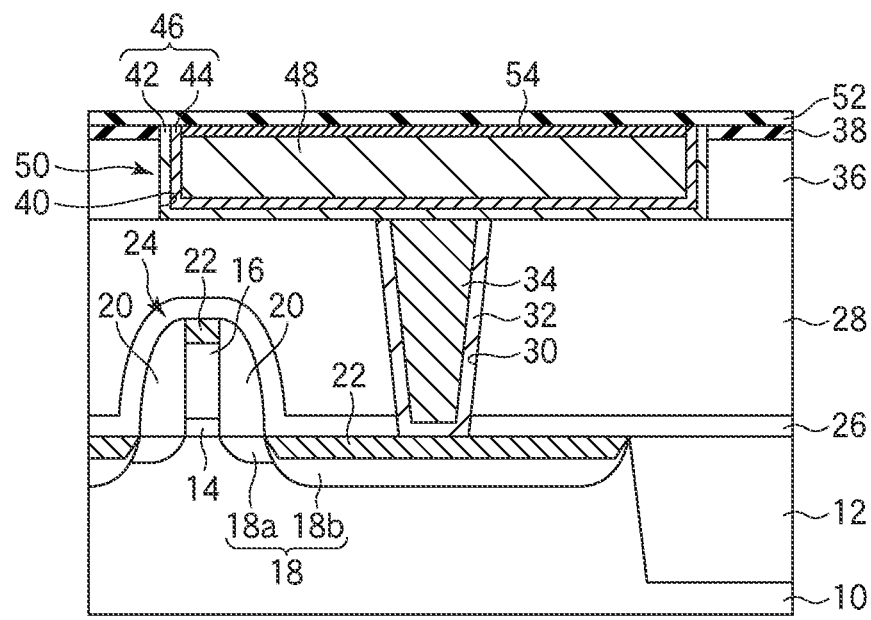

Next, on the interconnections 50 and the cap film 38, the barrier insulation film 52 of, e.g., SiCN film or SiCO film is formed by, e.g., CVD (see FIG. 7B). The film thickness of the barrier insulation film 52 is, e.g., about 5-100 nm. The barrier insulation film 52 is formed, e.g., in one and the same reaction chamber continuously without opening the reaction chamber.

In the present embodiment, before the barrier insulation film 52 is formed, the thermal processing for diffusing the Ti of the Ti film 42 into the surfaces of the interconnections 50 to deposit is made, and the silylation processing for exposing the surfaces of the interconnections 50 to a silicon-content gas is made. Thus, the interface layer 54 containing Ti and Si is formed in the interfaces between the interconnections 50 and the barrier insulation film 52, i.e., the surfaces of the interconnections 50 (see FIG. 7B).

Next, on the barrier insulation film 52, the inter-layer insulation film 56 of low dielectric constant insulation film is formed. As the inter-layer insulation film 56, the low dielectric constant insulation film of, e.g., SiOC film is formed.

Next, on the inter-layer insulation film 56, the inter-layer insulation film 58 of low dielectric constant insulation film is formed. As the inter-layer insulation film 58, a coating-type porous low dielectric constant insulation film, for example, is formed.

Figure 8A:
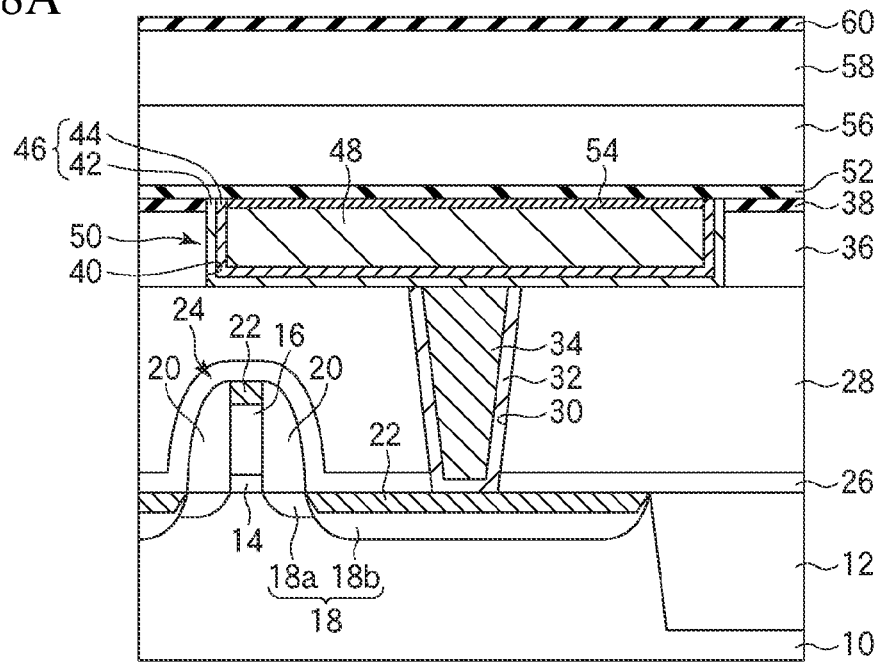
FIGS. 8A and 8B are sectional views of the semiconductor device according to the first embodiment in the steps of the method for manufacturing the semiconductor device, which illustrate the method (Part 7)

Next, on the inter-layer insulation film 58, the cap film 60 of, e.g., SiN film or SiC film is formed (see FIG. 8A). The film thickness of the cap film 60 is, e.g., about 10-100 nm.

Figure 8B:
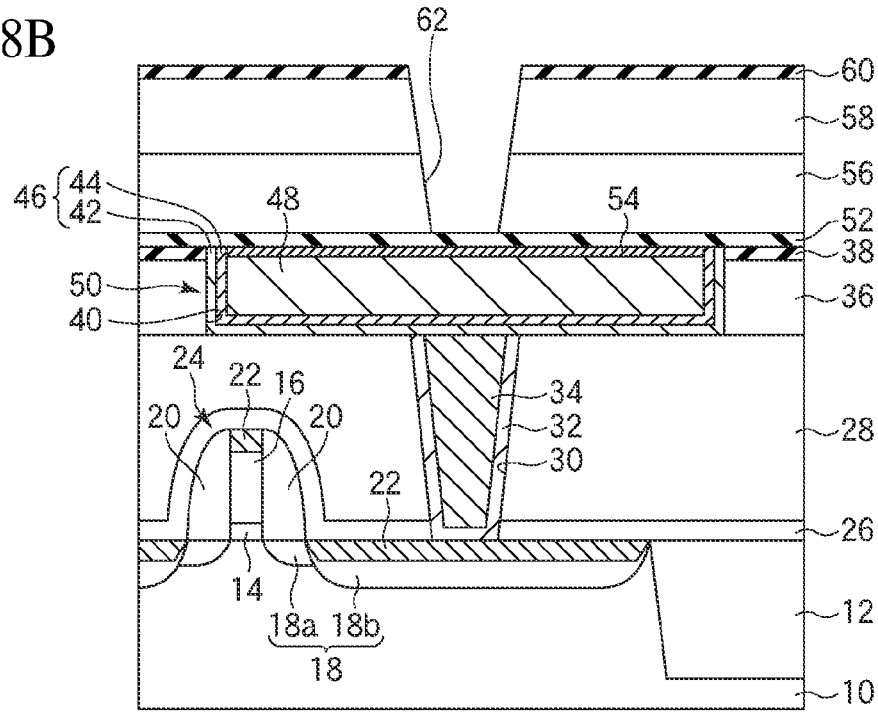

Then, by photolithography and dry etching, the contact holes 62 are formed in the cap film 60, the inter-layer insulation film 58 and the inter-layer insulation film 56 (see FIG. 8B).

Figure 9A:
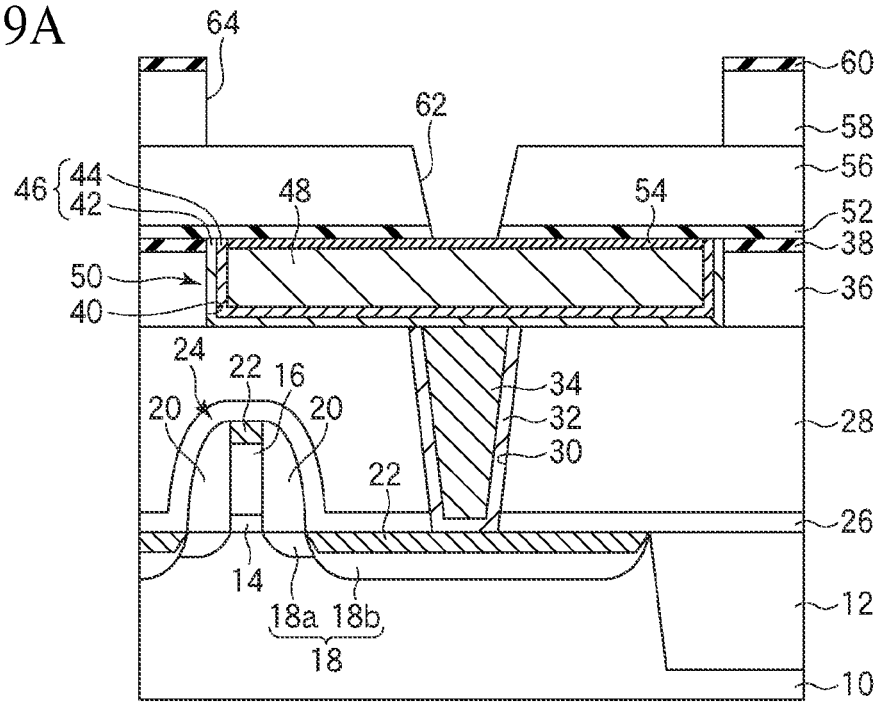
FIGS. 9A and 9B are sectional views of the semiconductor device according to the first embodiment in the steps of the method for manufacturing the semiconductor device, which illustrate the method (Part 8)

Then, by photolithography and dry etching, in the cap film 60 and the inter-layer insulation film 58, the interconnection trenches 64 connected to the tops of the contact holes 62 are formed, and simultaneously therewith, the barrier insulation film 52 on the interconnections 50 is removed to arrive at the contact holes 62 at the interconnections 50 (see FIG. 9A).

The interface layer 54 at the bottoms of the contact holes 62 is removed in the step in which the deposition and the etching of Ta simultaneously advance, which will be described later.

Then, on the side surfaces and the bottom surfaces of the contact holes 62, the bottom surfaces and the side surfaces of the interconnections 64, and the cap film 60, a Ti film 66 is formed by, e.g., long-throw sputtering. The film thickness of the Ti film 66 is, e.g., about 0.5-10 nm. The conditions for forming the Ti film 66 are as exemplified below. The target electric power is, e.g., 0.5-18 kW. The substrate bias is, e.g., 0-500 W. Under these conditions, the Ti film 66 is formed so that Ti film 66 on the cap film 60 is 10 nm. At this time, the film thickness of the Ti film 66 on the side surfaces or the bottom surfaces of the contact holes 62 or on the side surfaces or the bottom surfaces of the interconnection trenches 64 is about 1.0 nm.

To improve the efficiency of the diffusion of the Ti of the Ti film 66 to deposit, which will be described later, it is preferable to form the Ti film 66 on the side surfaces or the bottom surfaces of the contact holes 62, or the side surfaces or the bottom surfaces of the interconnection trenches 64 so they can have parts whose film thickness is at least 0.5 nm or above.

Next, on the Ti film 66, a Ta film 68 is formed by, e.g., long-throw sputtering. The thickness of the Ta film 68 is, e.g., about 3-20 nm.

The Ta film 68 is formed by the sputtering of two-steps of the step using the film forming conditions for advancing the deposition alone of the Ta, and the following step using the film forming conditions for simultaneously advancing the deposition and etching of the Ta, as exemplified below.

In the first step of advancing the deposition alone of the Ta, the Ta film 68 of a 5-10 nm-thickness is deposited under the film forming conditions of, e.g., 1-18 kW target power and 0 W substrate bias.

In the following step of simultaneously advancing the deposition and the etching of the Ta, the film forming conditions of, e.g., 1-18 kW target power and 0-500 W substrate bias are used so the deposition rate Vd and the etching rate Ve on the cap film 60, i.e., the flat parts can be respectively 0.7 nm/s and 0.9 nm/s. Under the conditions for thus simultaneously advancing the deposition and the etching of the Ta, the Vd/Ve ratio is smaller at the bottoms of the interconnection trenches 64 or the contact holes 62 than on the cap film 60, i.e., at the flat parts. Resultantly, at least a part of the Ti film 66 at the bottoms of the interconnection trenches 64 or the contact holes 62 is etched and attaches again to the side surfaces of the interconnection trenches 64 or the contact holes 62. In this case, on the surfaces of the Ta film 68 formed on the side surfaces of the interconnection trenches 64 or the contact holes 62, the mixed layer of the Ti and Ta is formed. This improves the efficiency of diffusing and deposit the Ti on the surfaces of the interconnections 76. The Ti film 66 on the bottoms of the contact holes 62 is etched off, or the Ta film 68 is not substantially formed on the bottoms of the contact holes 62. This makes good contacts of the interconnections 50 and the conductor plugs 74.

Figure 9B:
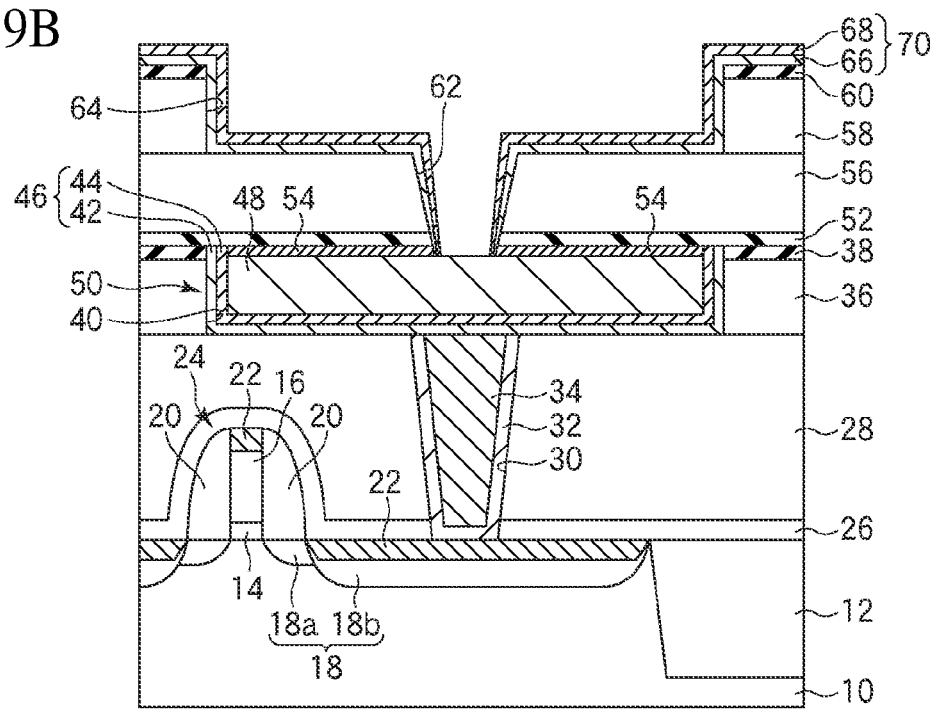

Thus, on the side surfaces of the contact holes 62, on the side surfaces and the bottom surfaces of the interconnection trenches 64, and on the cap film 60, the barrier metal film 70 of the layer film of the Ti film 66 and the Ta film 68 is formed (see FIG. 9B).

Figure 10A:
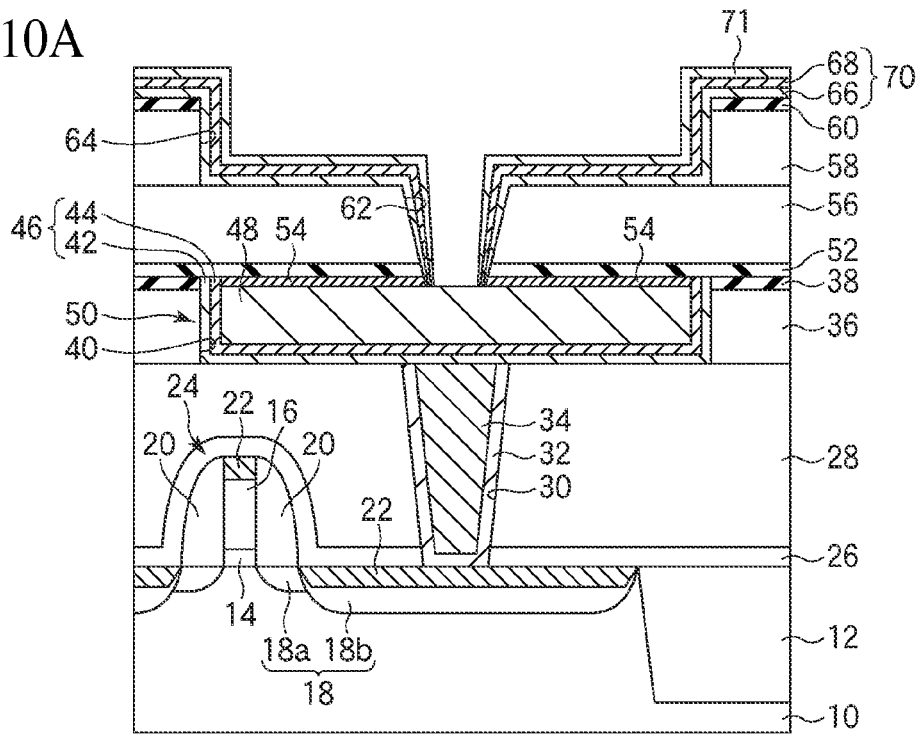
FIGS. 10A and 10B are sectional views of the semiconductor device according to the first embodiment in the steps of the method for manufacturing the semiconductor device, which illustrate the method (Part 9)
Figure 10B:
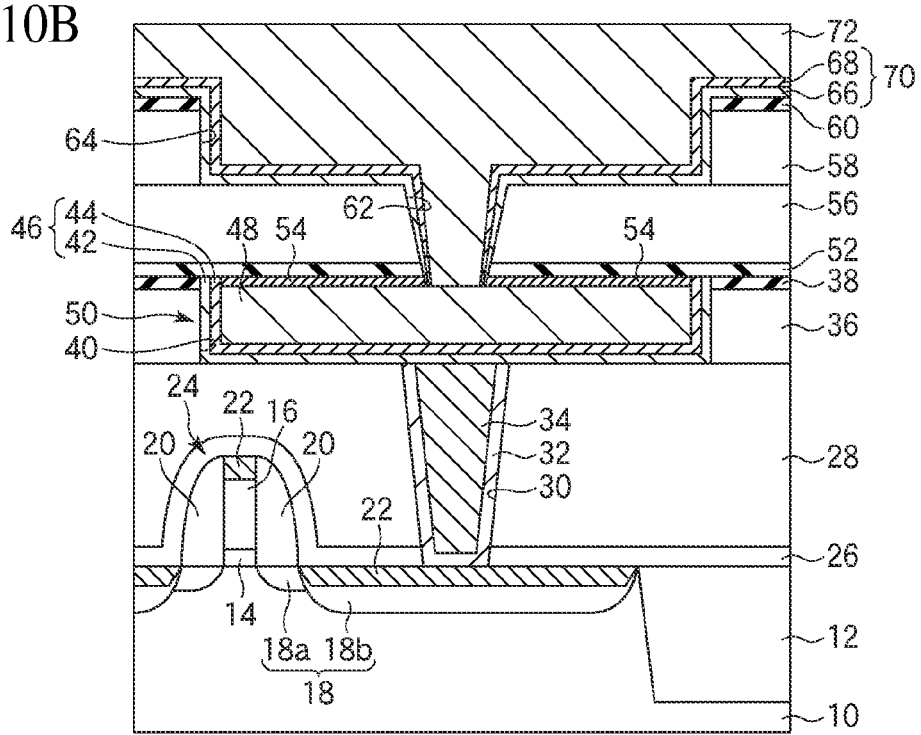

Then, on the barrier metal film 70, the seed film 71 of Cu film is formed by, e.g., sputtering (see FIG. 10A). The film thickness of the seed film 71 is, e.g., about 10-300 nm. The seed film 71 functions as the electrode in forming a Cu film 72 by electroplating.

Next, on the entire surface, the Cu film 72 is formed by electroplating. The thickness of the Cu film 72 is, e.g., about 100-1500 nm. Thus, the contact holes 62 and the interconnection trenches 64 are filled with the Cu film 72 (see FIG. 10B).

Then, the Cu film 72 and the barrier metal film 70 are polished by CMP until the surface of the cap film 60 is exposed to planarize the Cu film 72. Thus, by the so-called dual damascene method, the conductor plugs 74 of Cu are buried in the contact holes 62 and the interconnections 76 of Cu are buried in the interconnection trenches 64 (see FIG. 11A). The conductor plugs 74 and the interconnections 76 are formed integral with each other.

Then, thermal processing is made to diffuse the Ti of the Ti film 66 into the surface of the interconnections 76 to deposit. The thermal processing temperature is, e.g., about 256-450° C. The thermal processing period of time is, e.g., 1 second to 30 minutes, specifically about 10 seconds. This thermal processing may be made in vacuum, or in hydrogen gas, ammonium gas, argon gas, helium gas, nitrogen gas or a mixed gas of these gases. Furthermore, the thermal processing may be made while plasma processing is made on the surfaces of the interconnections 76 and the cap film 60. The plasma processing may be made before or after the thermal processing. For the plasma processing, a plasma atmosphere generated by using hydrogen gas, ammonium gas, argon gas, helium gas, nitrogen gas or a mixed gas of these gases is used.

The diffusion and the deposition of the Ti on the surfaces of the interconnections 76 can be advanced by heat which will be applied in later steps. The thermal processing for diffusing the Ti of the Ti film 66 into the surfaces of the interconnections 76 to deposit may not be made essentially independently.

Then, silylation processing for exposing the surfaces of the interconnections 76 to silicon-content gas is made. The processing conditions for the silylation processing are as exemplified below. As the silicon-content gas, $SiH_4$ gas is used. The processing temperature is about 256-450° C. The processing pressure is about 0.1-10 Torr. The processing period of time is about 1 second to 3 minutes.

Before and after the silylation processing, plasma processing may be made on the surfaces of the interconnections 76 and the cap film 60. For the plasma processing, a plasma atmosphere generated by using, e.g., hydrogen gas, ammonium gas, argon gas, helium gas, nitrogen gas or a mixed gas of these gases.

Figure 11A:
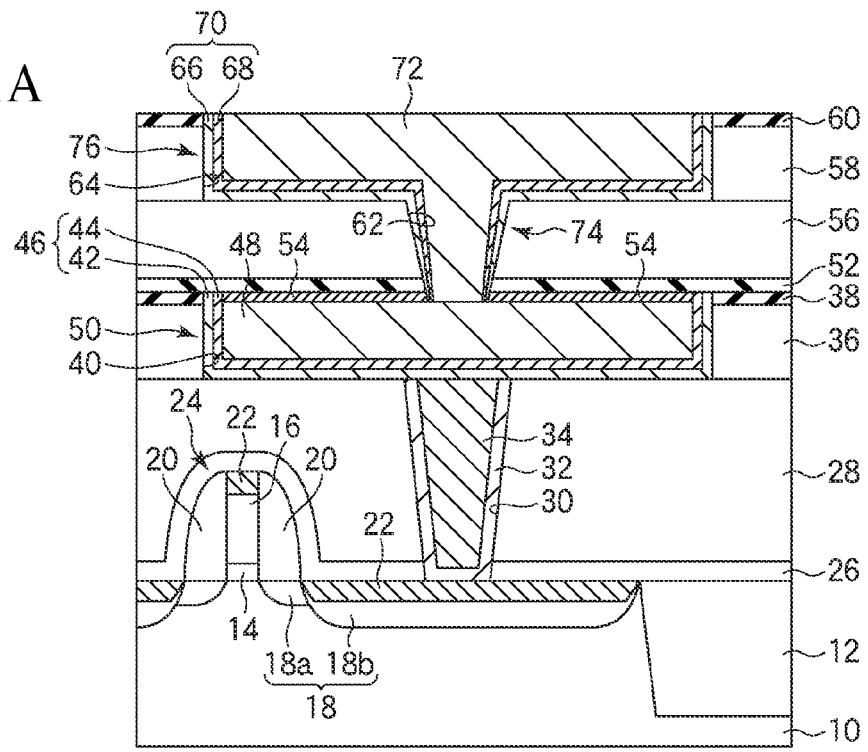
FIGS. 11A and 11B are sectional views of the semiconductor device according to the first embodiment in the steps of the method for manufacturing the semiconductor device, which illustrate the method (Part 10)
Figure 11B:
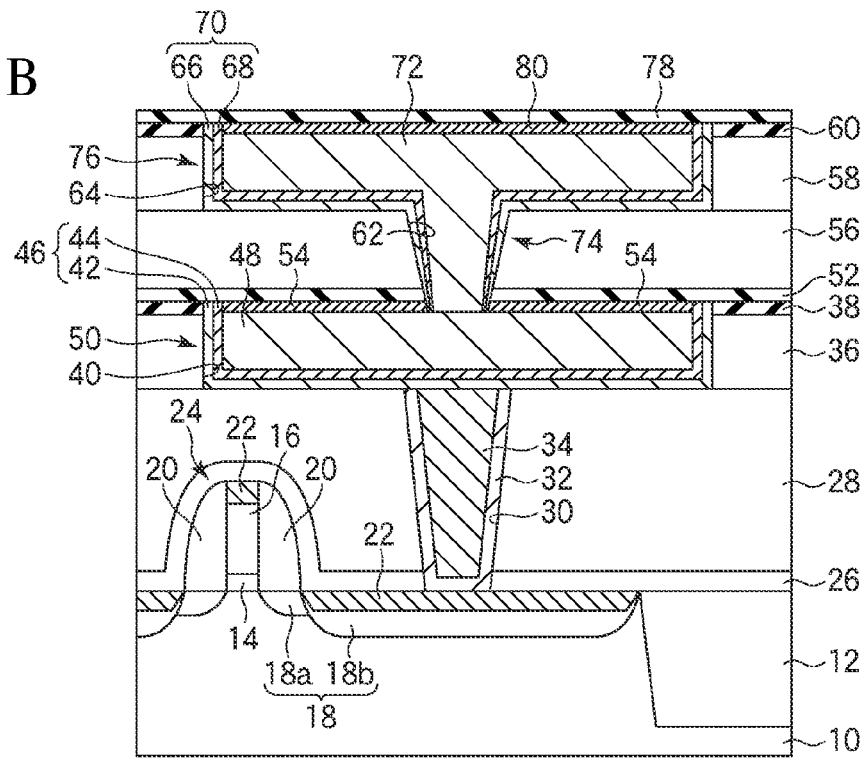

Next, on the interconnections 76 and the cap film 60, the barrier insulation film 78 of, e.g., SiCN film or SiCO film is formed by, e.g., CVD (see FIG. 11B). The film thickness of the barrier insulation film 78 is, e.g., about 5-100 nm. The barrier insulation film 78 is formed in one and the same reaction chamber continuously without opening the reaction chamber.

In the present embodiment, before the barrier insulation film 78 is formed, thermal processing for diffusing the Ti of the Ti film 66 into the surfaces of the interconnections 76 to deposit is made, and the silylation processing for exposing the surfaces of the interconnections 76 to silicon-content gas is made. Thus, the interface layer 80 containing Ti and Si is formed in the interface between the interconnections 76 and the barrier insulation film 78, i.e., the surfaces of the interconnections 76 (see FIG. 11B).

Then, in the same way as, e.g., the interconnections 76 are formed, interconnections not illustrated are further formed.

Thus, the semiconductor device according to the present embodiment illustrated in FIG. 1 is manufactured.

As described above, in the present embodiment, the layer film of Ti film and Ta film is formed as the barrier metal films 46, 70. Furthermore, in the present embodiment, before the barrier insulation films 52, 78 are formed, the thermal processing for diffusing the Ti of the Ti films 42, 66 of the barrier metal films 46, 70 into the surfaces of the interconnections 50, 76 to deposit is made, and the silylation processing for exposing the surfaces of the interconnections 50, 76 to silicon-content gas is made. Thus, the interface layers 54, 80 containing Ti and Si are formed on the surfaces of the interconnections 50, 76.

According to the present embodiment, because of the interface layers 54, 80 containing Ti and Si formed on the surfaces of the interconnections 50, 76, the adhesion between the interconnections 50, 76 and the barrier insulation film 52, 78 can be improved. Thus, the degradation of the stress migration resistance can be drastically improved without degrading the electro-migration resistance. Because of the layer film of Ti film and Ta film as the barrier metal films 46, 70, the concentration of the Ti diffused in the interconnections 50, 76 of Cu can be suppressed low. Accordingly, the interconnection resistance can be retained low.

Thus, according to the present embodiment, as for the interconnections 50, 76 of Cu, the interconnection resistance can be retained low, and besides, the stress migration resistance can be drastically improved without degrading the electro-migration resistance.

Figure 12:
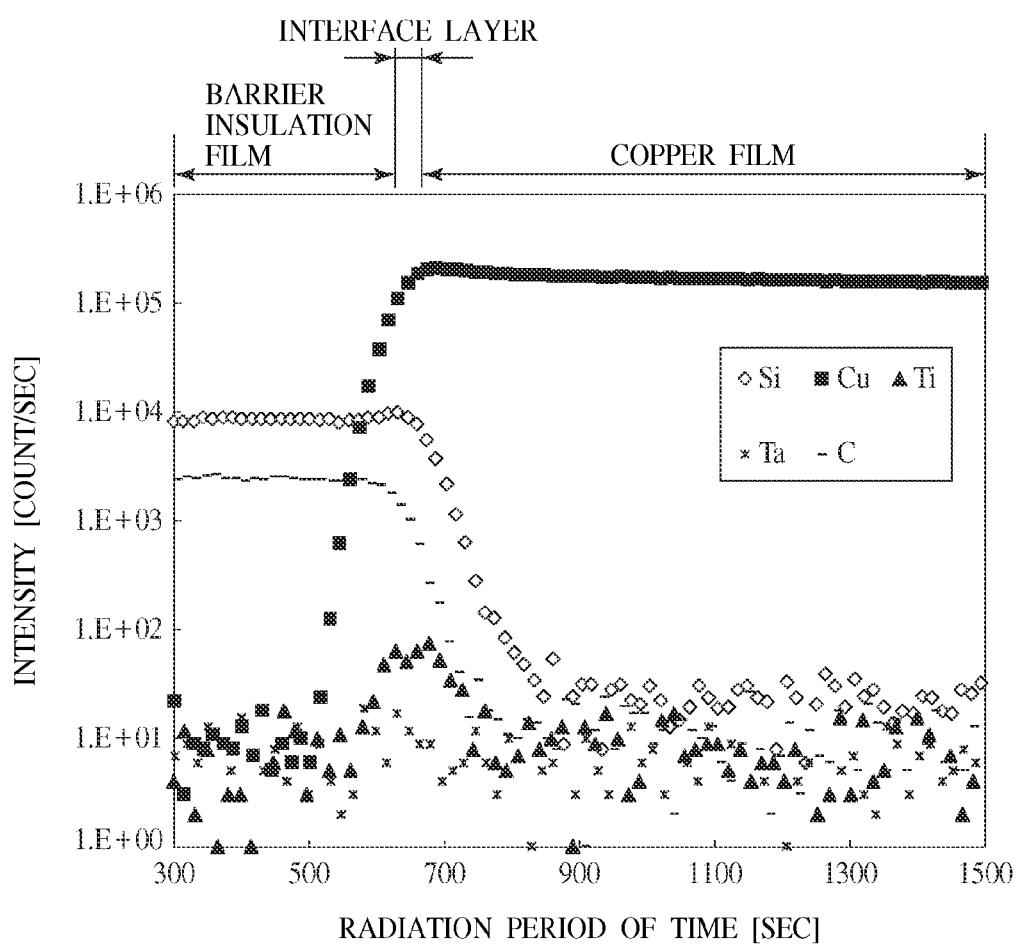
FIG. 12 is a graph (Part 1) of the result of analyzing by SIMS the depth-wise composition of samples subjected to the thermal processing and the silylation processing.
Figure 13:
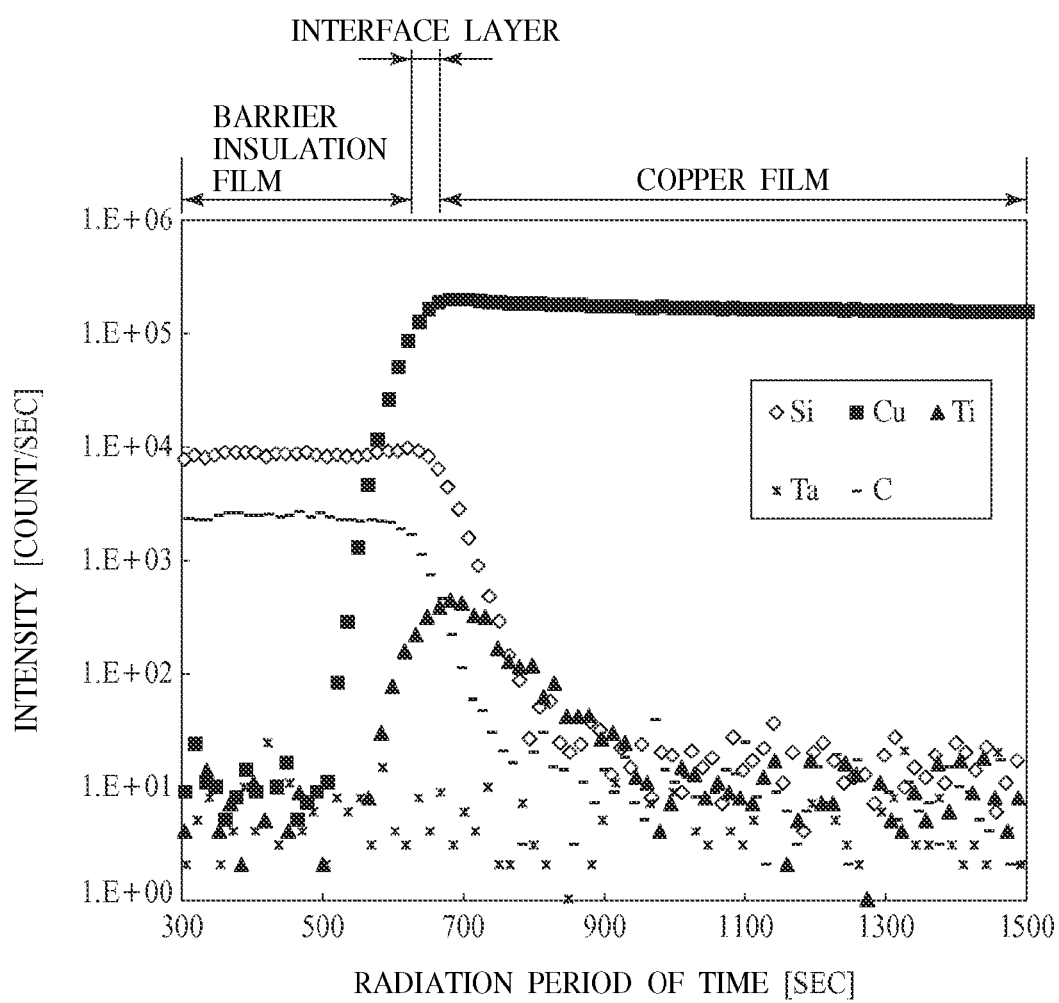
FIG. 13 is a graph (Part 2) of the result of analyzing by SIMS the depth-wise composition of the samples subjected to the thermal processing and the silylation processing.
Figure 14:
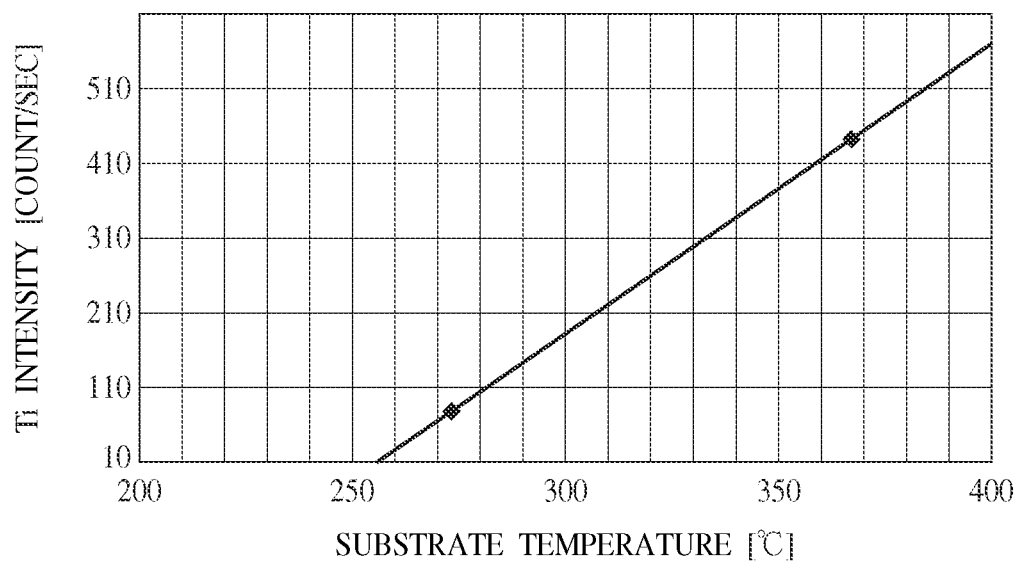
FIG. 14 is a graph of the relationships between the Ti intensity and the thermal processing temperature in the interface between the Cu film and the barrier insulation film.
Figure 15:
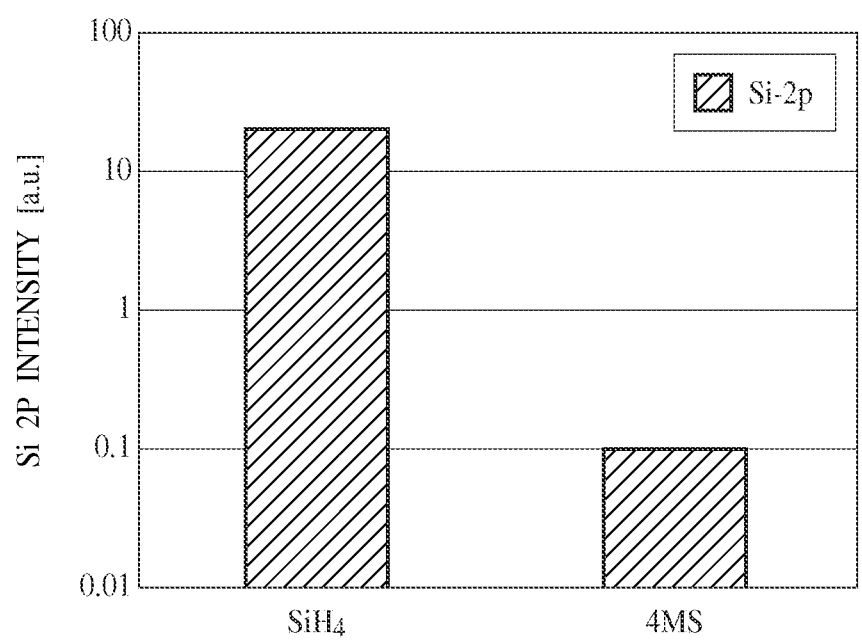
FIG. 15 is a graph of the result of measuring by XPS the Si intensity of the Cu film surface of a sample, which was exposed to $SiH_4$ gas, and the Si intensity of the Cu film surface of a sample, which was exposed to 4MS gas.

Here, the interface layers 54, 80 containing Ti and Si formed on the surfaces of the interconnections 50, 76 will be explained with reference to FIGS. 12 to 15. FIGS. 12 and 13 are graphs of the results of the depth-wise compositions of the samples subjected to the thermal processing and the silylation processing which have been analyzed by SIMS (Secondary Ion Mass Spectroscopy). FIG. 14 is a graph of the relationships between the Ti intensity and the thermal processing temperature of the interface between the Cu film and the barrier insulation film. FIG. 15 is a graph of the result of measuring by XPS (X-ray Photoelectron Spectroscopy) the Si intensity of the surfaces of the Cu films of samples having the surface of the Cu films exposed to $SiH_4$ gas and samples having the surfaces of the Cu films exposed to 4MS gas.

To confirm the formation of the interface layer containing Ti and Si by the thermal processing and the silylation processing as described above, samples were prepared and analyzed by SIMS.

The samples analyzed by SIMS were prepared as follows. A 15 nm-thickness Ti film, a 3 nm-thickness Ta film, a 60 nm-thickness Cu film and a 30 nm-thickness barrier insulation film were sequentially laid on a silicon substrate with silicon oxide film formed therebetween. Before the barrier insulation film was formed, the thermal processing for diffusing the Ti into the surface of the Cu film to deposit, and the silylation processing for exposing the surface of the Cu film to silane gas were made. The samples were of 2 kinds one of which was prepared with the temperature of the thermal processing for diffusing and depositing the Ti set at 274° C. and the other of which was prepared with the temperature of the thermal processing for diffusing and deposit the Ti set at 368° C.

FIG. 12 is a graph of the result of analyzing by SIMS the depth-wise composition of the sample prepared with the thermal processing temperature set at 274° C. FIG. 13 is a graph of the result of analyzing by SIMS the depth-wise composition of the sample prepared with the thermal processing temperature set at 368° C. In FIGS. 12 and 13, on the horizontal axis of the graphs, the application period of time of primary ions corresponding to depths of the samples, and the intensities of the detected secondary ions are taken on the vertical axis.

As illustrated in FIGS. 12 and 13, in all the samples, Ti and Si are detected in the interface between the Cu film and the barrier insulation film. Based on this, it is found that the interface containing Ti and Si is formed on the surface of the Cu film.

It is also found that in all the samples, the Ti concentration of the Cu film except the vicinity to the interface with the barrier insulation film is suppressed low. In the present embodiment, the Ti concentration of the Cu film is suppressed thus low, whereby the interconnection resistance will be suppressed low.

When FIG. 12 and FIG. 13 are compared to each other, it is found that the Ti concentration of the interface between the Cu film and the barrier insulation film of the sample having the thermal processing temperature set at 368° C. is higher than that of the sample having the thermal processing temperature set at 274° C.

Based on the result of the above analysis by SIMS, it has been confirmed that the interface layer containing Ti and Si is formed in the interface between the interconnections of Cu and the barrier insulation film.

FIG. 14 is a graph of the Ti intensities of the interface between the Cu film and the barrier insulation film, which has been given by the result of the above analysis by SIMS plotted with respect to the thermal processing temperatures, i.e., the substrate temperatures.

Based on the graph of FIG. 14, at the thermal processing temperature of 256° C. or above, the Ti beings to diffuse into and deposit on the interface between the Cu film and the barrier insulation film. Thus, it is preferable that the temperature of the thermal processing for diffusing the Ti into the surfaces of the interconnections of Cu and deposit is set at 256° C. or above.

To retain the interconnection resistance low, it is preferable not to cause the Ti to excessively diffuse into the interconnections of Cu. In view of this, it is preferable that the temperature of the thermal processing for diffusing the Ti into the surfaces of the interconnections of Cu to deposit is set at 450° C. or below.

For the same reason, it is preferable that the temperature of the silylation processing for exposing the surfaces of the interconnections of Cu to silicon-content gas is set at 256° C. or above and 450° C. or below.

In the present embodiment, as described above, the silylation processing for exposing the surfaces of the interconnections of Cu is made before the barrier insulation film is formed. Thereafter also in forming the barrier insulation film, the surfaces of the interconnections are exposed also to tetramethyl silane (4MS) gas used as the raw material gas. However, by only the exposure to 4MS gas, substantially no Si is deposited on the surfaces of the interconnections as will be described below.

FIG. 15 compares the intensities of the Si-2p peak measured by XPS on the sample with the surface of the Cu film exposed to $SiH_4$ gas and the sample with the surface of the Cu film exposed to 4MS gas.

As evident in FIG. 15, in the sample exposed to $SiH_4$ gas, Si deposits on the surface of the Cu film, but in the sample exposed to 4 MS gas, substantially no Si is deposits on the surface of the Cu film.

As described above, 4 MS gas used as the raw material gas of the barrier insulation film cannot supply Si sufficient to form the interface layer containing Ti and Si. Thus, it is preferable to independently make the silylation processing for exposing the surfaces of the interconnection surfaces of Cu to a silicon-content gas, such as $SiH_4$ gas or others before the barrier insulation film is formed.

(Evaluation Result)

Figure 16:
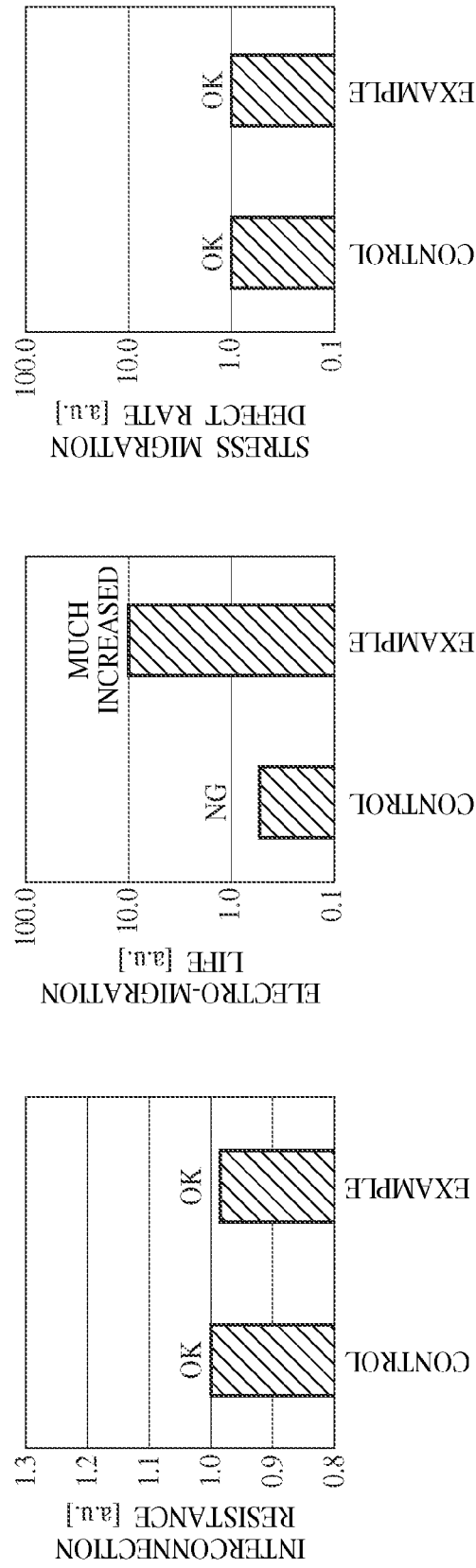
FIGS. 16A to 16C are graphs of the result of evaluating the method for manufacturing the semiconductor device according to the first embodiment.

Next, the result of evaluating the method for manufacturing the semiconductor device according to the present embodiment will be explained with reference to FIG. 16. FIG. 16 is graphs of the result of evaluating the method for manufacturing the semiconductor device according to the present embodiment.

In FIG. 16A, the sample of an example and the sample of a control are compared in the interconnection resistance. In FIG. 16B, the electro-migration life is compared between both samples. In FIG. 16C, the stress migration defect rate is compared between both samples.

The sample of the example is the interconnection formed by the method for manufacturing the semiconductor according to the present embodiment. The sample of the control is the interconnection using a barrier metal film of a Ta-based material and having no interface layer, i.e., the interconnection formed by the method for manufacturing the semiconductor device illustrated in FIGS. 18A to 22B.

The electro-migration life was evaluated by the electromigration test in which current of a 2.5 $MA/cm^2$ current density was flowed at 250° C. The stress migration defect rate was evaluated by the stress migration test in which the samples were retained for 504 hours at 200° C.

As illustrated in FIG. 16A, in the sample of the example, the interconnection resistance is retained low, as in the sample of the control.

As illustrated in FIG. 16B, in the sample of the example, the electro-migration resistance is much improved in comparison with that of the sample of the control. The electro-migration life of the sample of the example is 10 times or above the electro-migration life of the sample of the control.

As illustrated in FIG. 16C, in the sample of the example, the stress migration defect rate is retained low, and the stress migration resistance is good, as in the sample of the control. It will be for the following reason that the stress migration resistance of the sample of the example is not degraded. That is, in the sample of the example having the barrier metal film of the layer film of a Ti film and a Ta film and the interface layer containing Ti and Si, the adhesion between the Ta film on the Ti film, and the Cu film is so good that concavities and convexities in the surfaces of the interconnections which are one factor for the degradation of the stress migration resistance can be made small. Thus, in the sample of the example, the degradation of the stress migration resistance will be prevented.

Based on this, according to the present embodiment, it has been confirmed that the interconnections of Cu retain the interconnection resistance low and besides can much improve the electro-migration resistance without degrading the stress migration resistance.

[b] Second Embodiment

Figure 17:
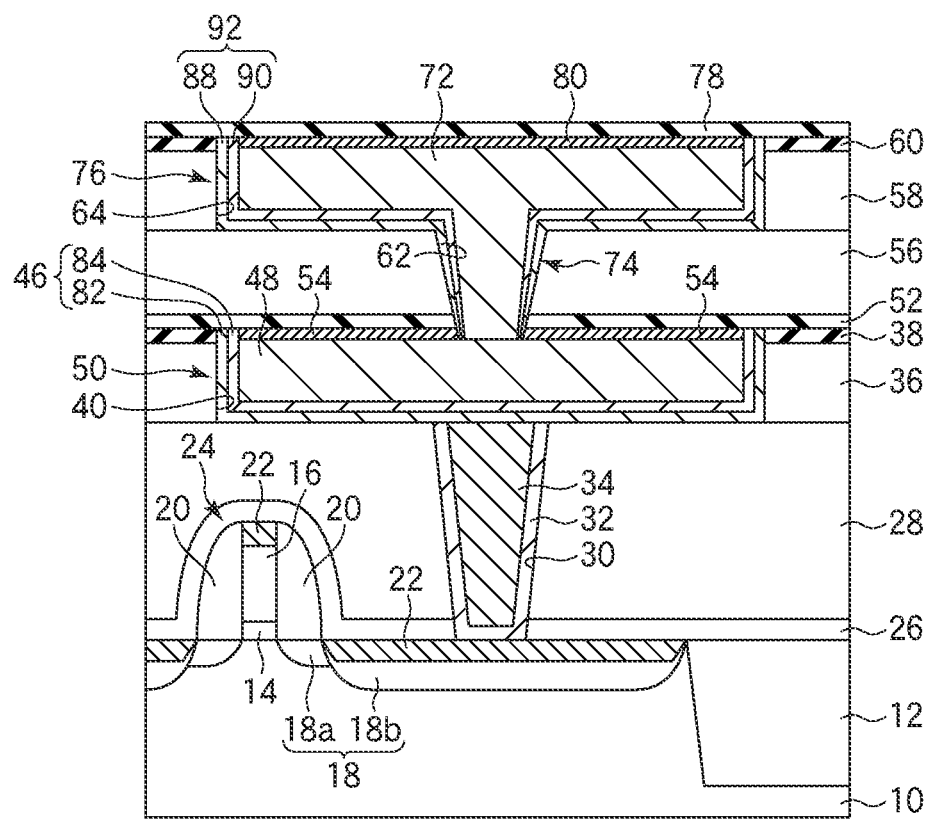
FIG. 17 is a sectional view of the semiconductor device according to a second embodiment.

The semiconductor device according to a second embodiment and the method for manufacturing the semiconductor device will be explained with reference to FIG. 17. FIG. 17 is a sectional view of the semiconductor device according to the present embodiment. The same members of the present embodiment as those of the semiconductor device according to the first embodiment and the method for manufacturing the semiconductor device are represented by the same reference numbers not to repeat or to simplify their explanation.

The semiconductor device according to the present embodiment is characterized mainly in that barrier metal films 86, 88 of the layer film of a Ti film and a Ta film are used in place of the barrier metal films 46, 70 of the layer film of a Ti film and a Ta film.

As illustrated in FIG. 17, a Ti film 82 is formed in interconnection trenches 40, i.e., on the side surfaces and the bottom surfaces of the interconnection trenches 40.

On the Ti film 82 in the interconnection trenches 40, a TaN film 84 is formed.

Thus, on the side surfaces and the bottom surfaces of the interconnection trenches 40, the barrier metal film 86 of the layer film of the Ti film 82 and the TaN film 84 is formed. The barrier metal film 86 is for preventing the diffusion of the Cu of the interconnections 50 into the inter-layer insulation film. It is possible that a TiN film is formed between the Ti film 82 and the TaN film 84 to thereby form the barrier metal film 86 of the layer film of the Ti film 82, the TiN film and the TaN film 84.

In the interconnection trenches 40 with the barrier metal film 86 formed in, a Cu film 48 is buried.

Thus, in the interconnection trenches 40, the interconnections 50 of Cu are buried.

On the interconnections 50 and the cap film 38, a barrier insulation film 52 is formed.

In the interface between the interconnections 50 and the barrier insulation film 52, i.e., on the surfaces of the interconnections 50, an interface layer 54 containing Ti and Si is formed. The Ti contained in the interface layer 54 has been supplied by diffusing, by thermal processing, the Ti of the Ti film 82 of the barrier metal film 86 into the surfaces of the interconnections 50 to deposit. The Si contained in the interface layer 54 has been supplied by exposing the surfaces of the interconnections 50 to a silicon-content gas.

A Ti film 88 is formed in the contact holes 62 and in the interconnection trenches 64, i.e., on the side surfaces of the contact holes 62 and on the side surfaces and the bottom surfaces of the interconnection trenches 64.

On the Ti film 88 in the contact holes 62 and in the interconnection trenches 64, a TaN film 90 is formed.

Thus, on the side surfaces of the contact holes 62 and on the side surfaces and the bottom surfaces of the interconnection trenches 64, a barrier metal film 92 of the layer film of the Ti film 88 and the TaN film 90 is formed. It is possible that a TiN film is formed between the TiN film 88 and the TaN film 90 to form the barrier metal film 92 of the layer film of the Ti film 88, the TiN film and the TaN film 90.

A Cu film 72 is buried in the contact holes 62 and the interconnection trenches 64 with the barrier metal film 92 formed in.

Thus, conductor plugs 74 of Cu are buried in the contact holes 62, and interconnections 76 of Cu are buried in the interconnection trenches 64.

A barrier insulation film 78 is formed on the interconnections 76 and the cap film 60.

In the interfaces between the interconnections 76 and the barrier film 78, i.e., on the surfaces of the interconnections 76, an interface layer 80 containing Ti and Si is formed. The Ti contained in the interface layer 80 has been supplied by diffusing, by thermal processing, the Ti of the Ti film 88 of the barrier metal film 92 into the surfaces of the interconnections 76 to deposit. The Si contained in the interface layer 80 has been supplied by exposing the surfaces of the interconnections 76 to a silicon-content gas.

As in the present embodiment, the barrier metal films 86, 92 of the layer film of Ti film and TaN film may be used. Also in this case, as in the first embodiment, thermal processing for diffusing the Ti of the Ti films 82, 88 into the surfaces of the interconnections 50, 76 to deposit, and the silylation processing for exposing the surfaces of the interconnections 50, 76 to a silicon-content gas are made to thereby form the interface layers 54, 80 containing Ti and Si on the surfaces of the interconnections 50, 76.

As described above, the barrier metal films 86, 92 of the layer film of a Ti film and a TaN film are used to form the interface layers 54, 80 containing Ti and Si, whereby the interconnection resistance can be also retained low, and besides the electro-migration resistance can be also improved without degrading the stress migration resistance.

Modified Embodiments

The present invention is not limited to the above-described embodiments and can cover other various modifications.

For example, in the above-described embodiments, the Ti films 42, 66 forming the barrier metal films 46, are formed by sputtering but may not be formed essentially by sputtering. The Ti films may be formed by PVD, CVD or ALD (Atomic Layer Deposition). These film deposition methods may be suitably combined.

In the above-described embodiments, the Ta films 44, 68 forming the barrier metal films 46, 70 are formed by sputtering but may not be formed essentially by sputtering. The Ta films may be formed by PVD, CVD or ALD. These film deposition methods may be suitably combined.

In the above-described embodiments, the Cu films 48, forming the interconnections 50, 76 are formed by electroplating but may not be formed essentially by electroplating. The Cu film may be formed by PVD, CVD or ALD. These film deposition methods may be suitable combined.

In the above-described embodiments, as the silicon-content gas for exposing the surfaces of the interconnections 50, 76 of Cu, $SiH_4$ gas is used, but the silicon-content gas is not limited to $SiH_4$ gas. As the silicon-content gas for exposing the surfaces of the interconnections, in place of $SiH_4$ gas, polysilane gas or organic silane gas may be used. A mixed gas containing at least two of these gases may be used. As the organic silane gas can be used a gas of, e.g., trimethylsilane (3MS), trimethylsilylacetylene (TMSA), dimethylsilane (2MS), tetramethoxysilane (TMOS), dimethyldimethoxysilane (DMDMOS), tetramethylcyclotetrasiloxane (TMCTS), octamethylcyclotetrasiloxane (OMCTS), dimethyldiethoxysilane (DMDEOS), dimethylphenylsilane (DMPS), diphenyldimethoxysilane (DPDMOS), diphenyldiethoxysilane (DPDEOS), phenyldiethoxysilane (PDEOS), diethoxymethylsilane (DEMS) or others.

In the above-described embodiments, the barrier metal films 46, 70 are formed of the layer film of a Ti film and a Ta film, and the barrier metal films 86, 92 are formed of the layer film of a Ti film and a TaN film. The metal films forming the barrier metal films are not limited to then.

The lower films of the layer films forming the barrier metal films can be the metal film of Ti, nickel (Ni), cobalt (Co), zirconium (Zr), chrome (Cr), palladium (Pd), manganese (Mn), silver (Ag), aluminum (Al), tin (Sn) or others, or an alloy film containing at least two kinds of these metals. Films of the nitrides of these metals can be used.

The upper films of the layer films forming the barrier metal film can be metal film of Ta, rhenium (Re), tungsten (W), platinum (Pt), vanadium (V), ruthenium (Ru), gold (Au) or others, or an alloy film containing at least two kinds of these metals. Films of the nitrides of these metals can be used.

In the above-described embodiments, the barrier metal film 70 is not formed on the bottom surfaces of the contact holes 62. The barrier metal film 70 may be formed on the bottom surfaces of the contact holes 62.

In the above-described embodiments, the interface layers 54, 80 containing Ti and Si are formed respectively on the surfaces of the interconnections 50, 70. The interface layer containing Ti and Si may be formed on the surfaces of either of the interconnections 50 and the interconnections 70.

In the above-described embodiments, as the inter-layer insulation film with the interconnections 50 buried in, the inter-layer insulation film 36 of a single layer of low dielectric constant insulation film is formed. However, an inter-layer insulation film of a plurality of low dielectric constant insulation films may be formed.

In the above-described embodiments, as the inter-layer insulation film with the conductor plugs 74 and the interconnections 76 buried, the inter-layer insulation films 56, 58 of 2 layers of low dielectric constant insulation film are formed, but an inter-layer insulation film of a single, or a 3 or more layers of low dielectric constant insulation film may be formed.

In the above-described embodiments, as the inter-layer insulation films are formed of the coating-type porous film or the low dielectric constant insulation film of SiOC film. However, the inter-layer insulation films are not limited to them.

In the above-described embodiments, the present invention is applied to cases where interconnections of Cu are formed. However, the present invention is applicable widely to cases where conductors containing Cu are formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed:
1. A semiconductor device comprising:
a semiconductor substrate;
a first insulation film formed above the semiconductor substrate;
a trench formed in the first insulation film;
a conductor, which includes Cu, formed in the trench;
a layer film, which includes a first metal film and a second metal film, formed between the first insulation film and the conductor, the first metal film including Ti, the second metal film including Ta, and the second metal film being located between the conductor and the first metal film;
a barrier insulation film formed on the conductor and the first insulation film; and
a layer, which includes Ti and Si, formed in an interface between the conductor and the barrier insulation film.
2. The semiconductor device according to claim 1, wherein the layer film is formed on a side surface and a bottom surface of the trench.
3. The semiconductor device according to claim 1, wherein a first contact hole is formed in the first insulation film, the trench is connected to a top of the first contact hole, the layer film is formed on at least the side a side surface of the first contact hole, and on a side surface and a bottom surface of the trench.
4. The semiconductor device according to claim 1, further comprising:
a second insulation film formed directly on the barrier insulation film.
5. The semiconductor device according to claim 1, wherein the barrier insulation film includes silicon, carbon and nitrogen.
6. The semiconductor device according to claim 1, wherein the barrier insulation film includes silicon, carbon and oxygen.
7. The semiconductor device according to claim 1, wherein the layer is formed islets separated each other.

* * * * *